(12) United States Patent
Moon

(10) Patent No.: US 7,764,351 B2
(45) Date of Patent: Jul. 27, 2010

(54) METHOD FOR DECREASING MISALIGNMENT OF A PRINTED CIRCUIT BOARD AND A LIQUID CRYSTAL DISPLAY DEVICE WITH THE PRINTED CIRCUIT BOARD

(75) Inventor: Hoi-Sik Moon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 738 days.

(21) Appl. No.: 09/993,503

(22) Filed: Nov. 27, 2001

(65) Prior Publication Data
US 2002/0097366 A1   Jul. 25, 2002

(30) Foreign Application Priority Data
Nov. 27, 2000  (KR) .................................. 2000-71007

(51) Int. Cl.
*G02F 1/1345* (2006.01)
(52) U.S. Cl. ....................... 349/150; 349/149; 349/151; 349/152
(58) Field of Classification Search ......... 349/149–152; 345/104
See application file for complete search history.

(56) References Cited

U.S. PATENT DOCUMENTS

| | | | | |
|---|---|---|---|---|
| 5,258,866 A | | 11/1993 | Ishikawa et al. | 359/88 |
| 5,936,850 A | * | 8/1999 | Takahashi et al. | 361/784 |
| 6,320,691 B1 | * | 11/2001 | Ouchi et al. | 359/237 |
| 6,336,990 B1 | * | 1/2002 | Tanaka et al. | 156/306.9 |
| 6,583,515 B1 | * | 6/2003 | James et al. | 257/779 |

* cited by examiner

*Primary Examiner*—Hoan C Nguyen
(74) *Attorney, Agent, or Firm*—Innovation Counsel LLP

(57) ABSTRACT

A method for improving a misalignment of a printed circuit board and a liquid crystal display device with the printed circuit board are disclosed. A printed circuit board having a substrate and PCB lands formed at a portion of the substrate in the horizontal direction is provided and a tape carrier package having TCP leads corresponding to the PCB lands is also provided. The intervals among the PCB lands are amended by the thermal expansion amount of the substrate. After the printed circuit board and the tape carrier package are aligned, the printed circuit board and the tape carrier package are connected to each other by the thermo-compression bonding process. The misalignment due to the thermo-compression bonding process can be improved, decreasing the processing failures and increasing the productivity.

8 Claims, 30 Drawing Sheets

Sample 1

Sample 2

Sample 3

Sample 4

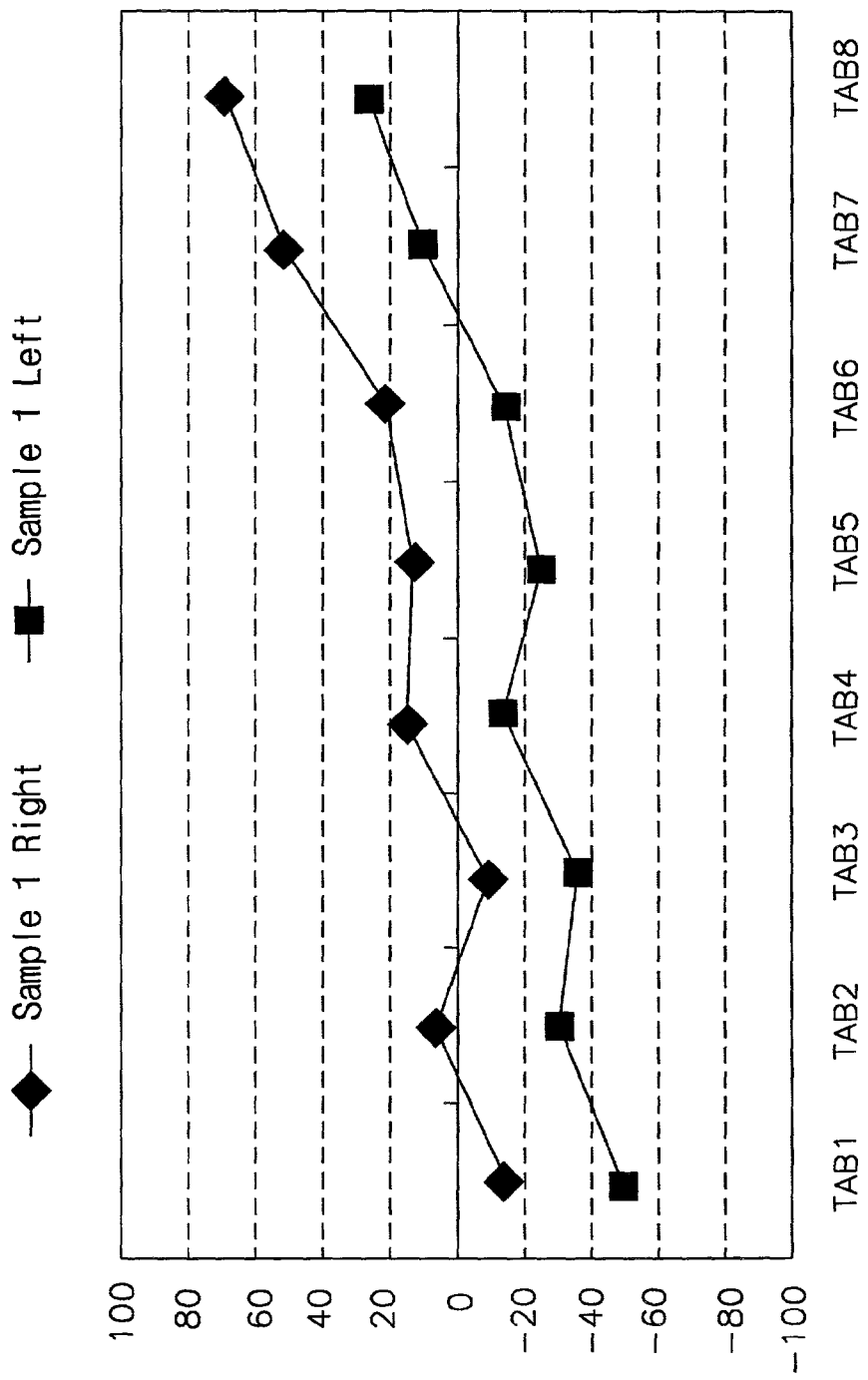

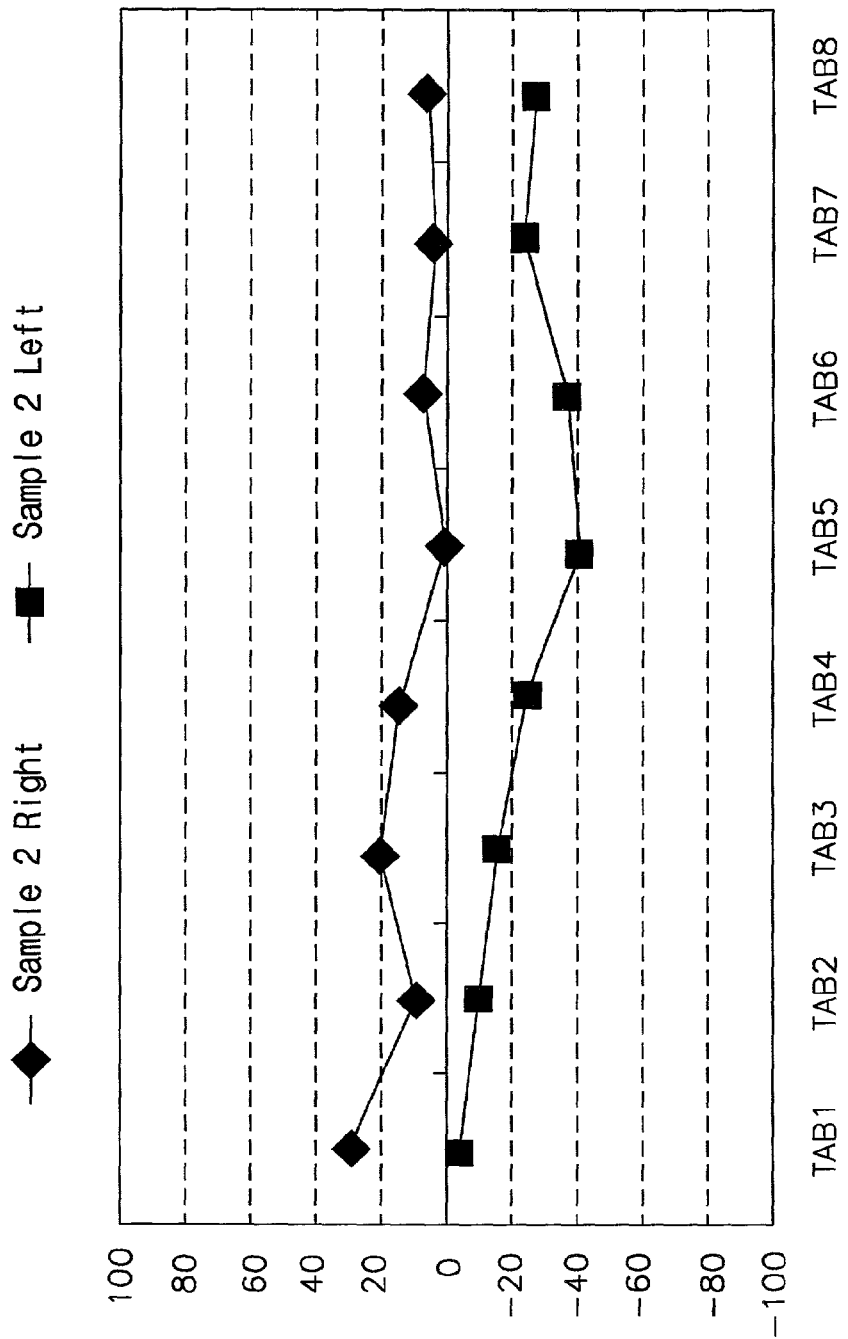

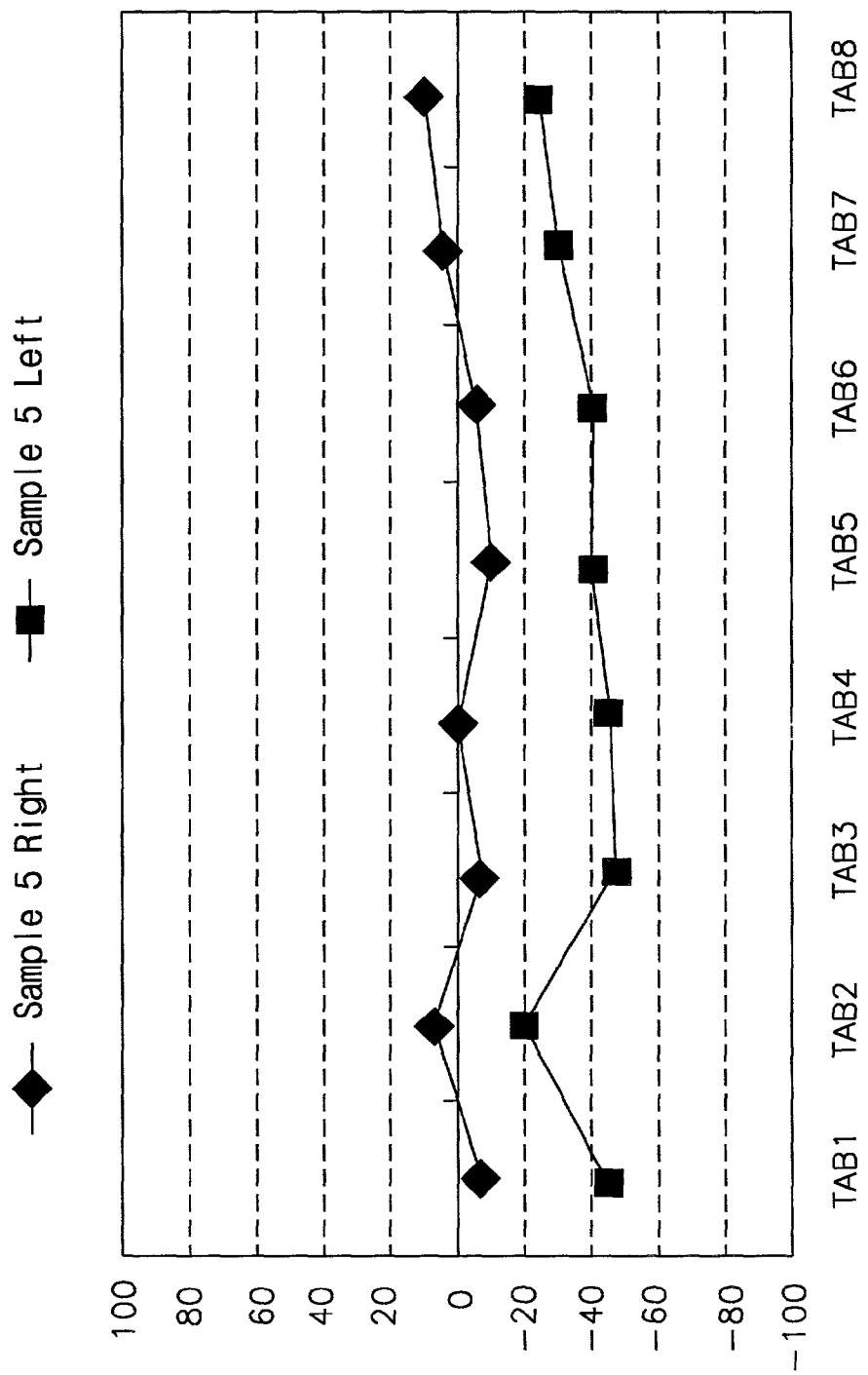

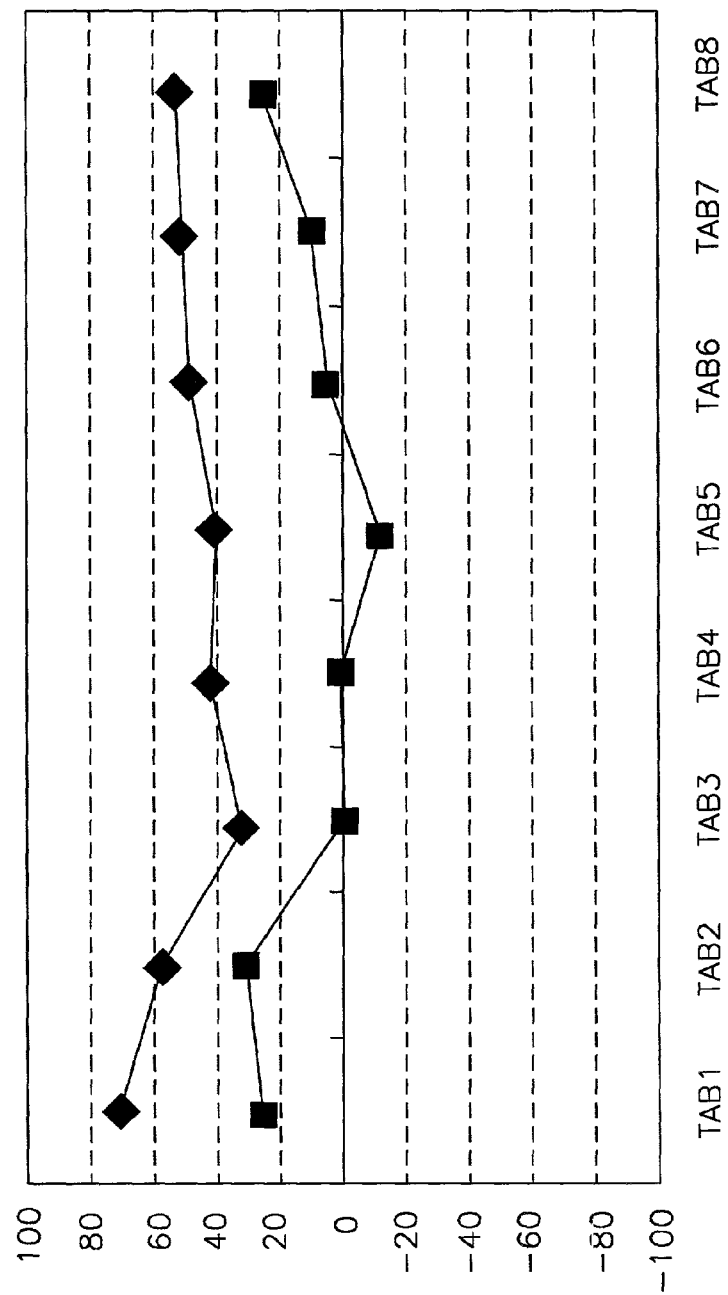

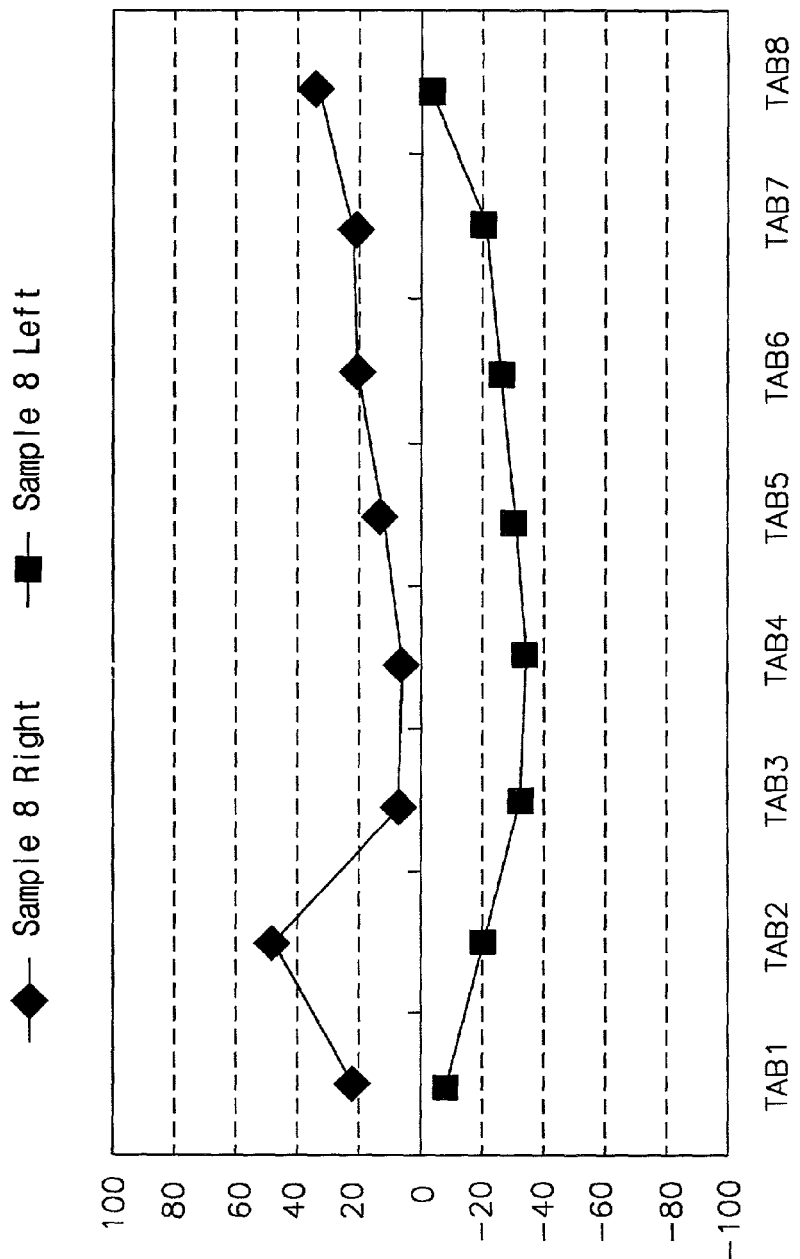

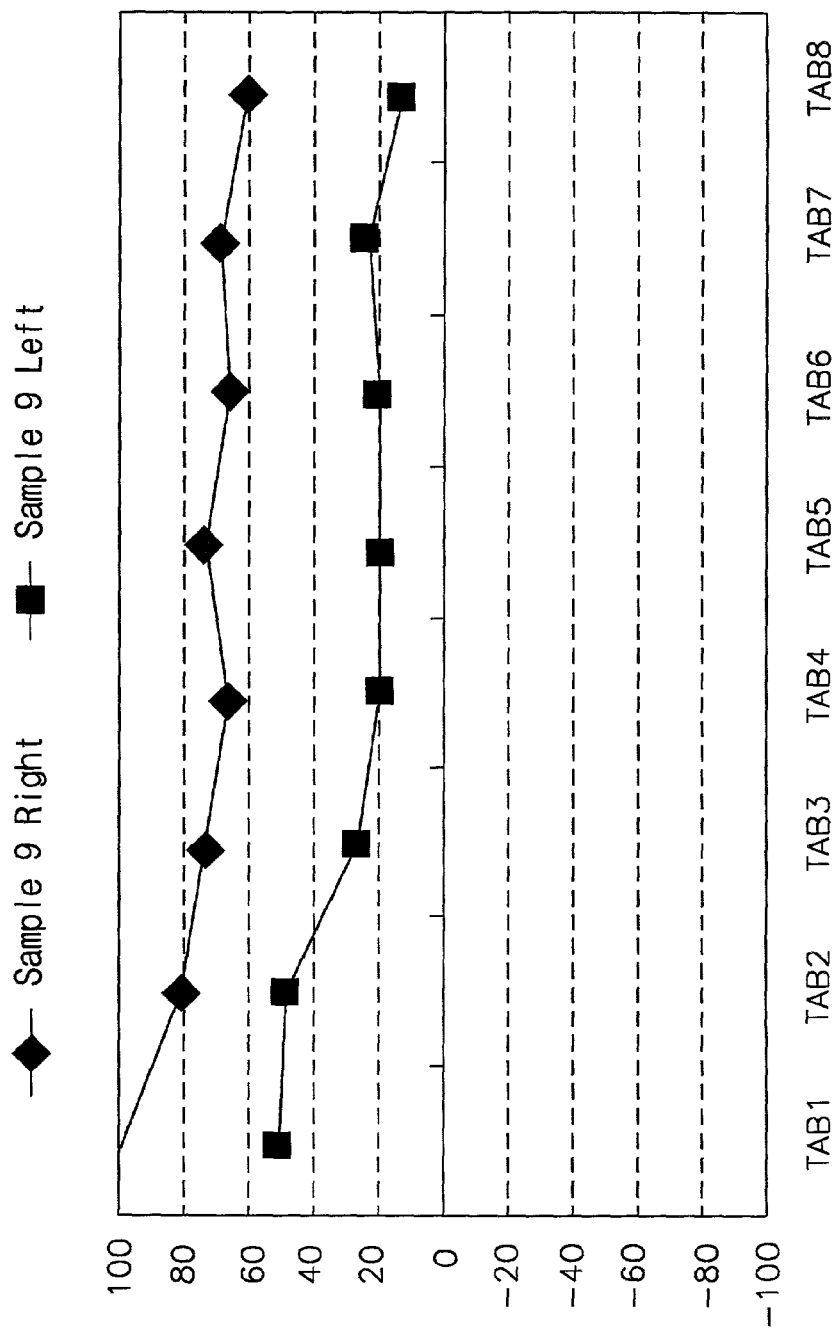

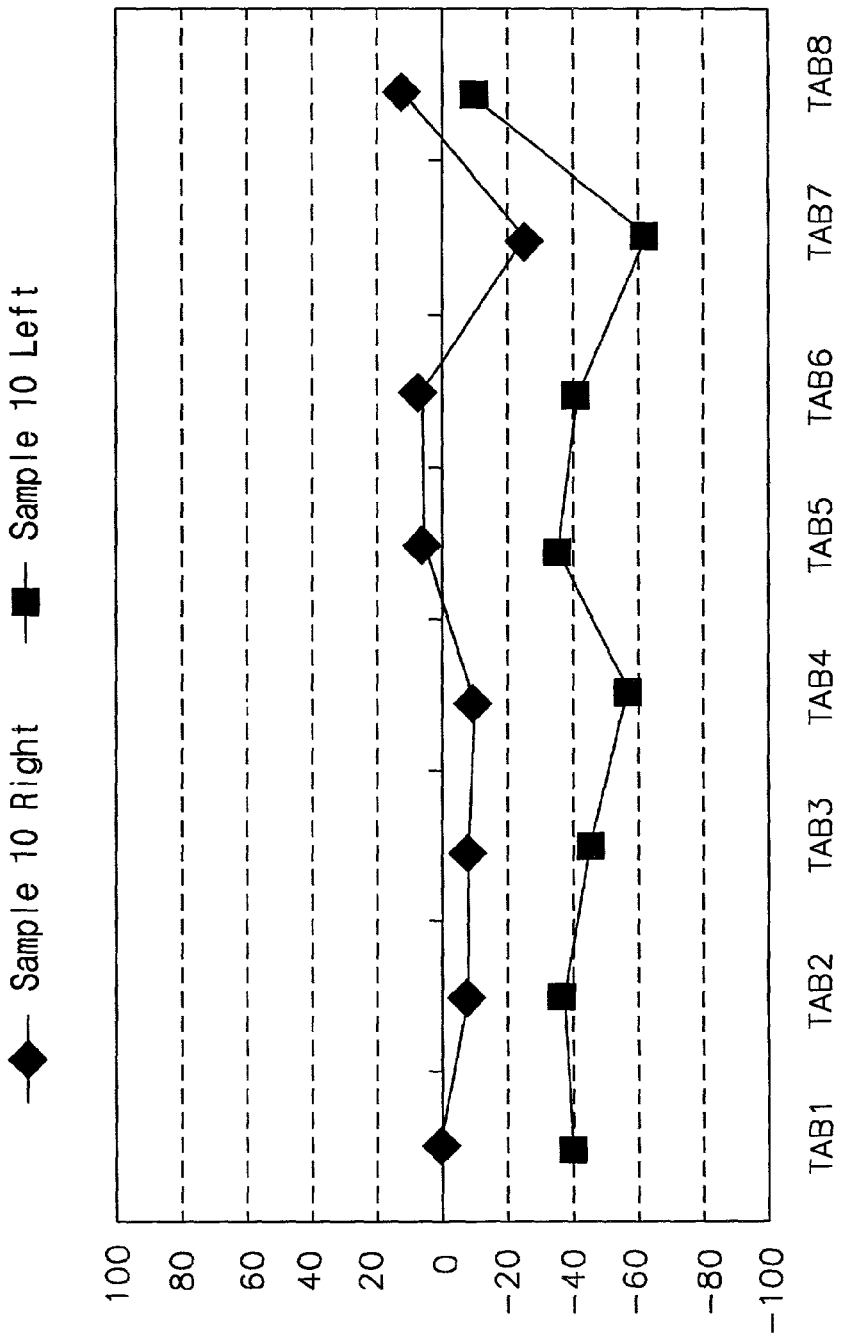

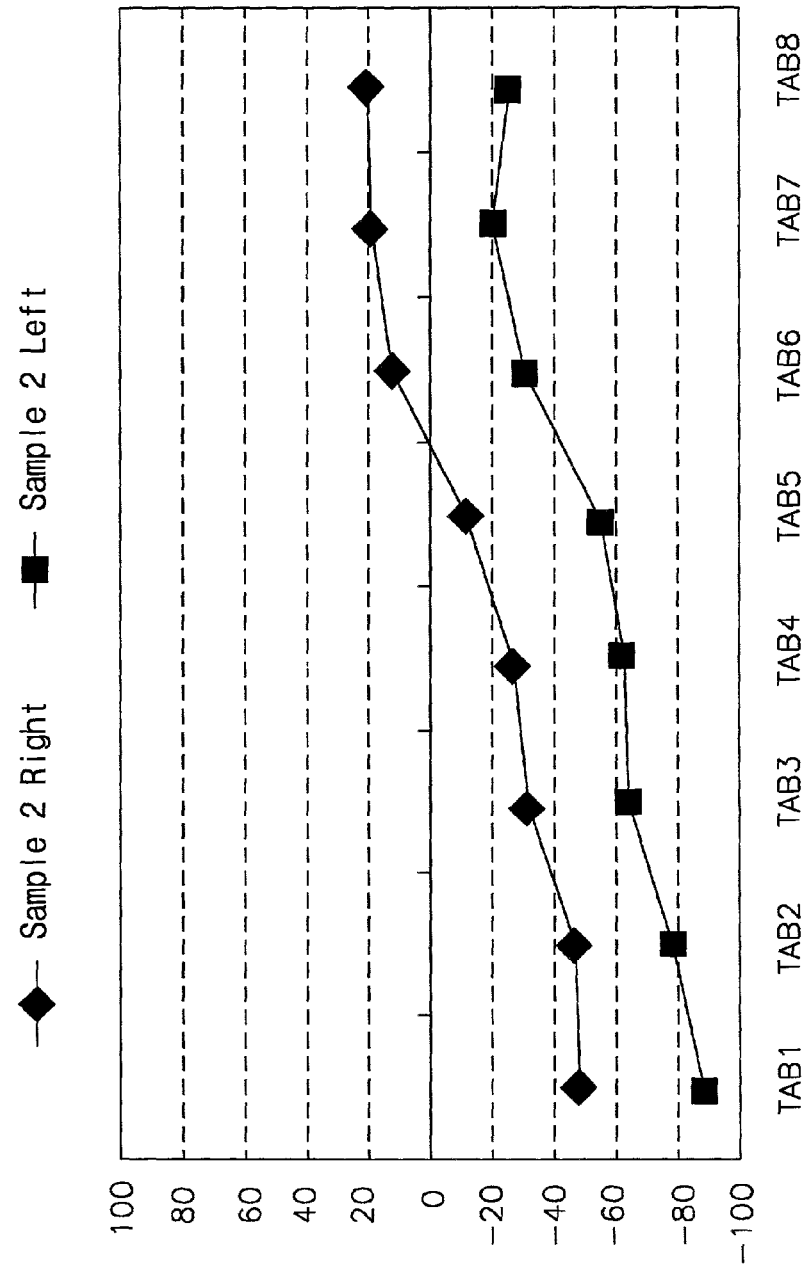

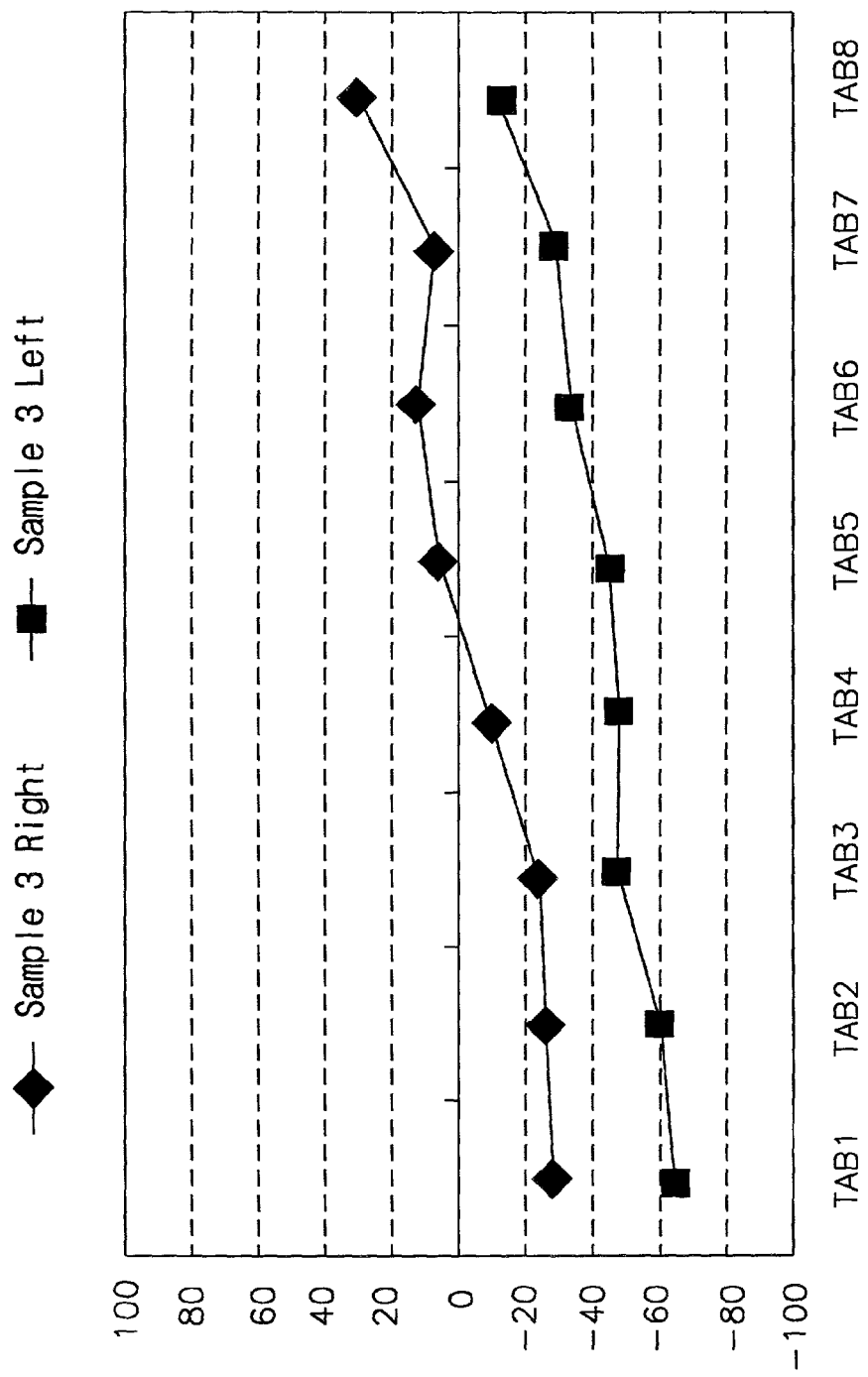

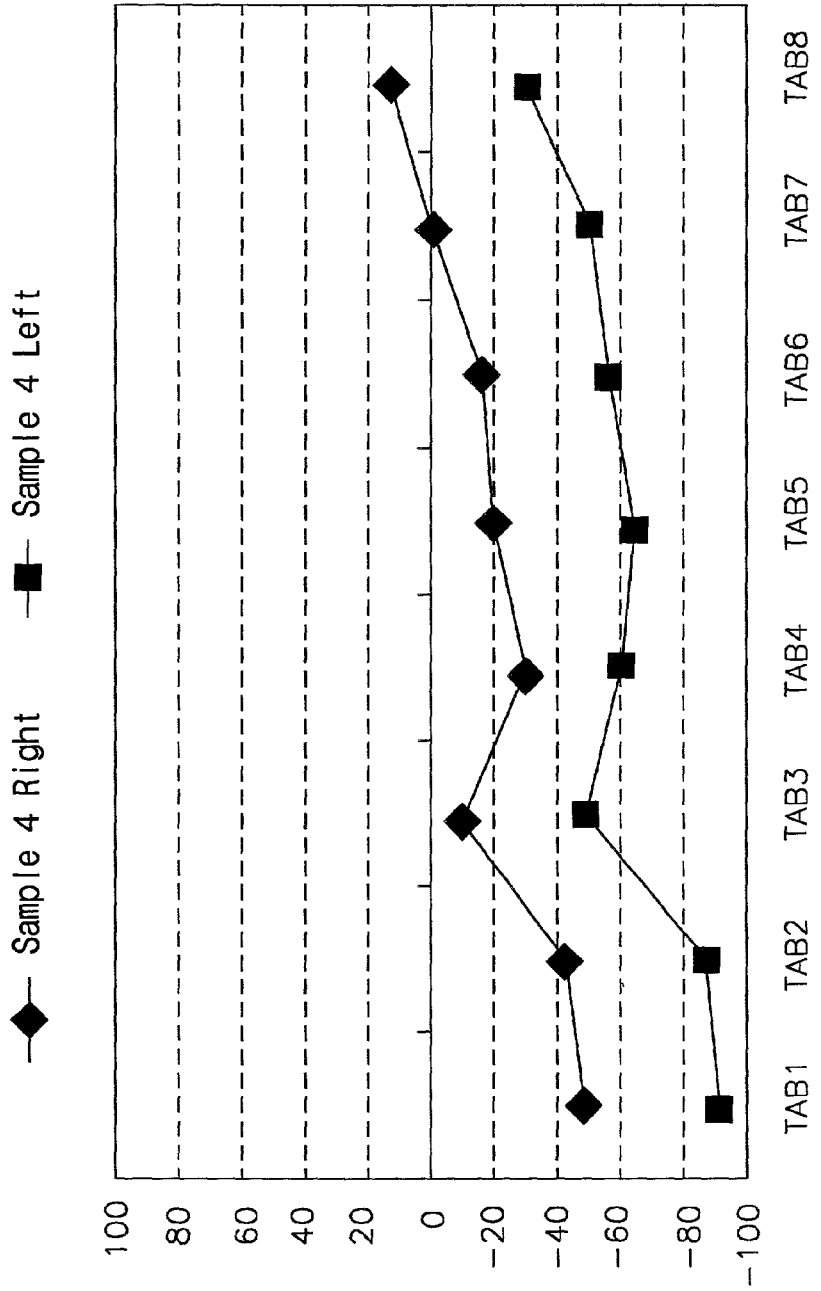

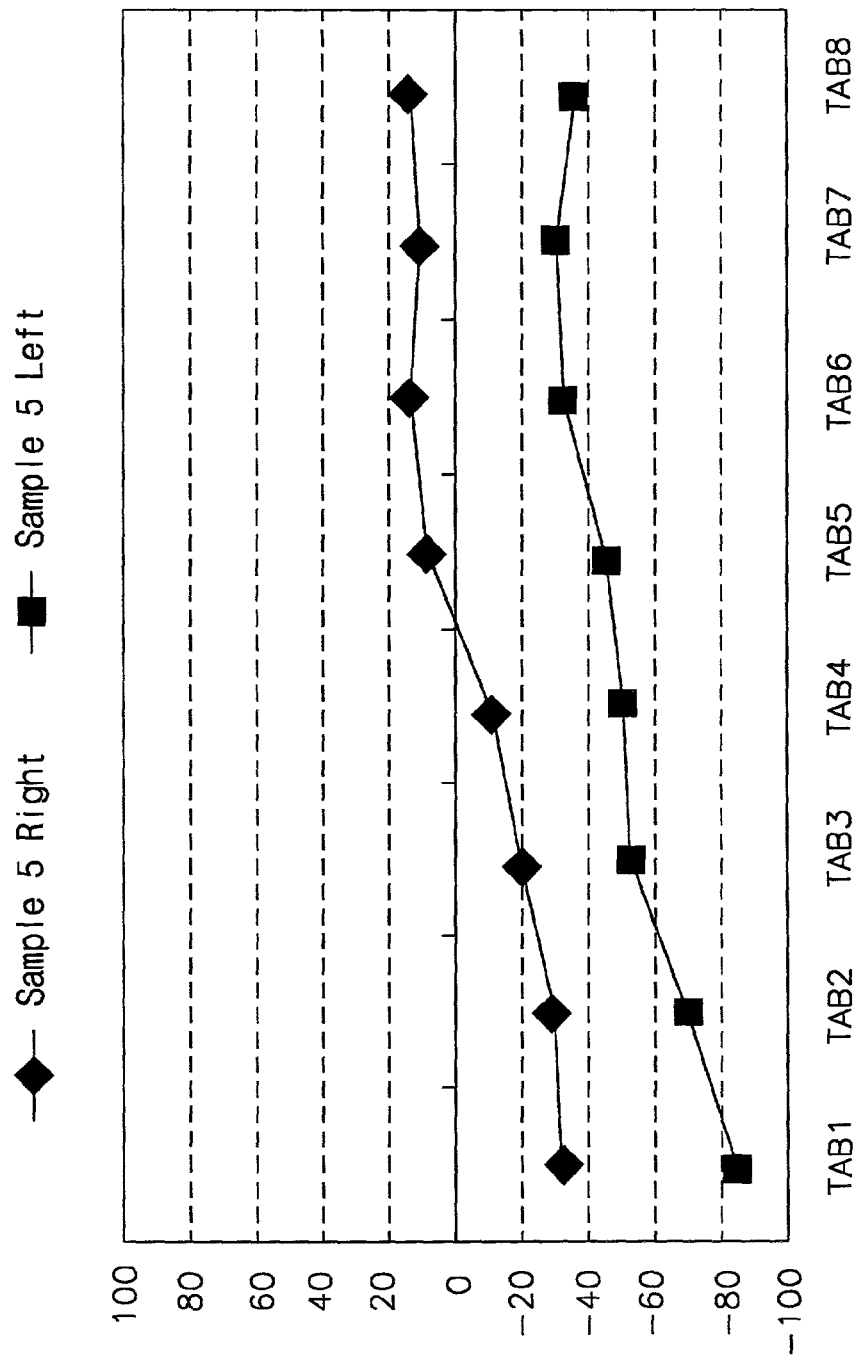

METHOD FOR DECREASING MISALIGNMENT OF A PRINTED CIRCUIT BOARD AND A LIQUID CRYSTAL DISPLAY DEVICE WITH THE PRINTED CIRCUIT BOARD

BACKGROUND OF THE INVENTION

1. Field of the Invention

The present invention relates to a liquid crystal display device, more particularly to a liquid crystal display device having a liquid crystal display panel that may decrease the failure of a tape automated bonding (TAB) by decreasing occasions of a printed circuit hoard (PCB) when a ductile printed circuit hoard (PCB) misalignment such as a tape carrier package (TCP) and the PCB are bonded by a thermo-compression bonding method.

2. Description of the Related Art

At present, a lot of display devices having minimized sizes and more powerful functions are manufactured as the semiconductor technology rapidly develops. The cathode ray tube (CRT) widely used for an information display device has some advantages such as high performance and low cost. However, the CRT has disadvantages of its bulky size and poor portability. The liquid crystal display (LCD) device has a smaller size and lighter weight. In addition, the LCD device can operate at low power. Hence, the LCD device has been paid much attention as substitute for the CRT and is now used for virtually all the information processing devices.

In general, the LCD device includes a thin film transistor (TFT) substrate, a color filter substrate opposed to the TFT substrate and a liquid crystal display panel having a liquid crystal injected between the TFT substrate and the color filter substrate. The LCD device displays the information by utilizing a light modulation resulting from the variation of the optical property of the liquid crystal.

A plurality of gate lines and a plurality of intersecting data lines are formed on the TFT substrate, and thin film transistors for switching device and the picture electrode are formed in the intersected region.

The data line receives the gray voltage selected by a source driving integrated circuit (IC), and then transfers the gray voltage to the liquid crystal. The gate line opens or closes the thin film transistor for switching according to the on/off signal outputted from a gate driving IC. At that time, in order to apply the driving signals to the gate line and the data line, the printed circuit board (PCB) including various semiconductor devices and parts thereon, the driving IC transferring the driving signals to the gate line and the data line and the liquid crystal display panel indicating the information should be connected one after another.

The methods for connecting the liquid crystal panel, the printed circuit board and the driving IC are generally divided into a chip on glass (COG) mounting method and a tape automated bonding (TAB) mounting method.

In the COG mounting method, the liquid crystal display panel is connected to the printed circuit board by using a connector such as a flexible printed circuit (FPC) after the driving IC is mounted on the liquid crystal display panel. Also, in the TAB mounting method, the liquid crystal display panel is connected to the printed circuit board by using a tape carrier package (TCP) including a tape and the driving IC mounted on the tape.

In the conventional TAB mounting method, the liquid crystal display panel is connected to the TCP by a thermo-Compression bonding process and by using an anisotropic conductive film (ACF), and the printed circuit board is connected to the TCP by a soldering process. However, the pitch of the input leads of the TCP must decrease as the number of the input leads of the TCP increases and the size of the TCP is reduced. As a consequence, the probability of short-circuits between the adjacent input leads of the TCP increases when the printed circuit board and the TCP are coupled to each other in the soldering process. Hence, the printed circuit board and the TCP are now being coupled together with a thermocompression bonding process.

FIG. 1 is a plan view illustrating the conventional liquid crystal display device including the printed circuit board and the tape carrier package bonded together by the thermo-compression bonding process at high temperature.

Referring to FIG. 1, a liquid crystal display panel 10 receives the electrical signal from the outside, and then displays the information thereon. Printed circuit boards 20 and 30 are connected to the liquid crystal display panel 10 and transfer the electrical signal to the liquid crystal display panel 10. Tape carrier packages 40 and 50 connect the liquid crystal display panel 10 to the printed circuit boards 20 and 30 to drive the liquid crystal display panel 10.

The liquid crystal display panel 10 includes a TFT substrate 14 and a color filter substrate 12 facing each other.

A plurality of gate lines (not shown) are disposed on the TFT substrate 14 along the length of the TFT substrate 14 and a plurality of data lines (not shown) are disposed on the TFT substrate 14 along the width of the TFT substrate 14. The gate lines and the data lines intersect each other. Gate input pads and data input pads (not shown) are respectively formed on each end of the gate lines and the data lines outside the color filter substrate 12.

The printed circuit boards 20 and 30 comprise a gate printed circuit board 20 electrically connected to the gate input pads through the TCPs 40, and a source printed circuit board 30 electrically connected to the data input pads through the TCPs 50.

A gate driving IC 42 and a source driving IC 52 that respectively drive the gate lines and the source lines are formed on the respective upper surfaces of the tape carrier packages 40 and 50.

Hereinafter, a method is described for connecting the liquid crystal display panel 10 to the printed circuit boards 20 and 30 by using the tape carrier packages 40 and 50.

At first, after the anisotropic conductive film is attached to the data pads and the gate pads on the TFT substrate, the output leads (not shown) of the tape carrier packages 40 and 50 are positioned on the surface of the anisotropic conductive film, and then the surfaces of the tape carrier packages 40 and 50 are pressed by a thereto-compression device. Thus, the gate pads and the data pads and the output leads of the tape carrier packages 40 and 50 are electrically connected while the anisotropic conductive film composed of a thermoplastic resin is completely compressed to the liquid crystal display panel 10 by the thermo-compression device.

Subsequently, after the anisotropic conductive film is attached to the surface of the respective PCB land groups (not shown) formed on the respective rear surfaces of the printed circuit boards 20 and 30, the input leads (not shown) of the tape carrier packages 70 and 90 are respectively attached to the land groups on the rear surfaces of the printed circuit boards 20 and 30 by using the thermo-compression device. Hence, the respective input leads of the tape carrier packages 40 and 50 are electrically connected to the respective PCB lands (not shown) of the printed circuit boards 20 and 30 while the anisotropic conductive film is hardened by the heat and the force of the thermo-compression device at a high temperature.

In the above-described method, however, thermal expansions of components may cause misalignments between the lands of the printed circuit boards 20 and 30 and the leads of the tape carrier packages 40 and 50, thereby causing bonding failures.

FIG. 2 is a plan view for showing the directions of thermal expansion of the printed circuit board and the tape carrier packages, as indicated therein by the respective arrows, during the thermo-compression bonding process. FIG. 2 shows the thermal expansions of the source printed circuit board and the tape carrier packages of FIG. 1.

As shown in FIG. 2, the printed circuit board 30 is thermally expanded from a central point M horizontally dividing the printed circuit board 30 into two equal portions disposed on opposite sides thereof. The amount of thermal expansion of the printed circuit board 30 is accumulated toward both opposite end portions of the printed circuit board 30 so that the two end portions have the greatest amount of thermal expansion. Also, each tape carrier package 50 is thermally expanded from a central point M' horizontally dividing the tape carrier package 50 into two equal portions disposed on opposite sides thereof, and the two opposite end portions have the greatest amount of thermal expansion.

Thus, although the PCB lands group (not shown) of the printed circuit board 30 and the corresponding lead groups of the tape carrier packages 50 are aligned with each other before the thermocompression process, they get misaligned during the thermo-compression bonding process due to the thermal expansion between the printed circuit board 30 and the tape carrier packages 50. They are misaligned the most in the right portion (A1) of a first TCP and the left portion of an eighth TCP (A2).

In order to reduce the bonding failures between the PCB lands and the TCPs caused by the misalignment, the thickness of the printed circuit board may be increased, or the composition of the printed circuit board may be changed. However, those methods do not totally solve the misalignment problem when the pitches between the leads become smaller.

SUMMARY OF THE INVENTION

It is therefore a first objective of the present invention to provide a method for bonding a printed circuit board and a tape carrier package to each other, which can decrease the occasions of misalignment due to thermal expansions of the printed circuit board and the tape carrier package when the printed circuit board and the tape carrier package are bonded to each other by a thermo-compression bonding method.

It is a second objective of the present invention to provide a liquid crystal display device manufactured according to the above method for bonding the printed circuit board and the tape carrier package so as to decrease the misalignment therebetween.

To accomplish the first objective of the present invention, one preferred embodiment of the present invention provides a method for bonding an adherent member to a printed circuit board, comprising the steps of providing the printed circuit board having a substrate and a land group disposed thereon, the land group comprising a plurality of a first conductive lands formed at a peripheral portion of the substrate in the direction of the length of the substrate, wherein the lateral position of the land group is "shrunk", i.e., adjusted according to the amount of thermal expansion of the substrate occurring during the thermo-compression bonding process, providing the adherent member having a lead group comprising a plurality of second conductive leads respectively corresponding to the first conductive lands of the land group, aligning the adherent member and the printed circuit board, and bonding the adherent member to the printed circuit board by a thermo-compression bonding method.

Also, to accomplish the second objective of the present invention, another preferred embodiment of the present invention provides a liquid crystal display device including a printed circuit board and a tape carrier package attached to each other by the above-mentioned method.

According to the present invention, when the PCB land groups are thermo-compressed with the corresponding lead groups of the tape carrier packages by mean of shrinking the PCB land groups of the printed circuit board by the amount of thermal expansion of the printed circuit board occurring during the bonding process, the misalignment between the leads of TCPs and the lands of the PCB due to the thermal expansion of the printed circuit board can be decreased sufficiently to secure an improved processing margin, so productivity can be improved by reducing processing failures. Also, the degree of misalignment between the leads and lands can be uniformly maintained to enhance control of the misalignment and thereby increase product manufacturing stability.

BRIEF DESCRIPTION OF THE DRAWINGS

The above objectives and advantages of the present invention will become more apparent by describing in detail preferred embodiments thereof with reference to the attached drawings:

FIGS. 9A, 9B, 9C, 9D, 9E, 9F, 9G, 9H, 9I and 9J are graphs respectively illustrating the misalignment of each of a plurality of samples on the basis of a central line of the shrinkage printed circuit board according to the table 7.

FIGS. 10A, 10B, 10C, 10D and 10E are graphs respectively illustrating the misalignment of each of a plurality of samples on the basis of the central line of the conventional printed circuit board according to the table 9.

DESCRIPTION OF THE PREFERRED EMBODIMENTS

Hereinafter, the present invention will now be described more fully with reference to the accompanying drawings, in which preferred embodiments of the present invention are shown. The present invention may, however, be embodied in many different forms and should not be construed as being limited to the embodiments set forth herein.

Figure 3A:
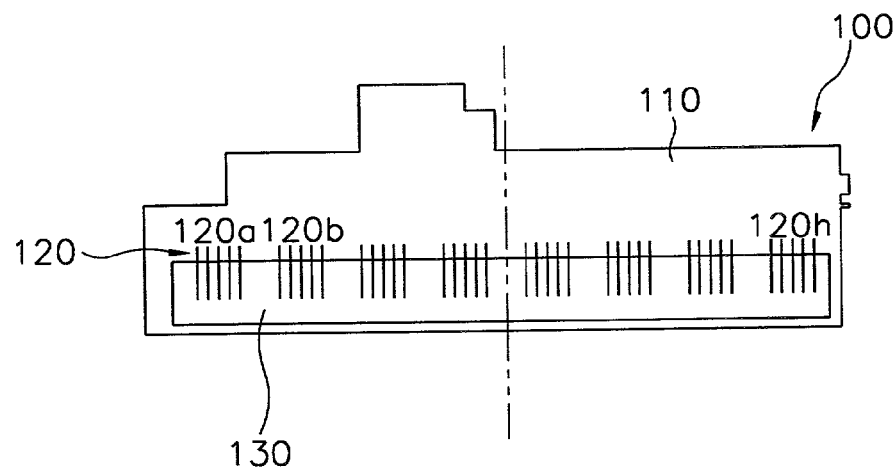
FIG. 3A is a plan view showing a shrinkage printed circuit board in the pre-compression bonding state according to one embodiment of the present invention.
Figure 3B:
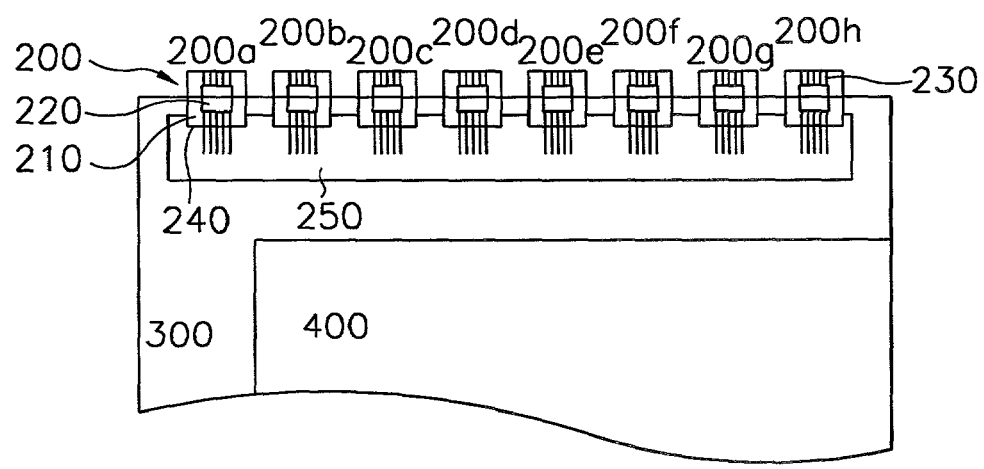
FIG. 3B is a plan view showing a tape carrier package in the pre-compression bonding state according to one embodiment of the present invention.

FIGS. 3A and 3B are plan views showing the printed circuit board and the tape carrier package according to one embodiment of the present invention.

Hereinafter, displacements toward the left are indicated by negative (−) numerical values and displacements toward the right are indicated by positive (+) numerical values.

Referring to FIG. 3A, a printed circuit board 100 according to the present invention has a substrate 110 and a plurality of land groups 120 that electrically connect the substrate 110 to an external device. Also, a driving circuit (not illustrated) is disposed on the printed circuit board 100 for operating the liquid crystal display device.

The land groups 120 are composed of a plurality of PCB land groups 120a through 120h, each of which has a plurality of conductive lands which are connected to input leads of a corresponding tape carrier package (TCP). As illustrated in FIG. 3A, each of the PCB land groups 120a to 120h has a lateral position that is "shrunk," or contracted, by a predetermined dimension in the direction of a central, or midpoint M located on a line perpendicular to the long edge of the PCB (phantom line in FIG. 3A) that divides the substrate 110 into two parts having equal horizontal lengths. That is, when compared to the respective lateral distances between adjacent land groups of the conventional printed circuit board 30 of FIG. 2, the distance between adjacent land groups of the printed circuit board 100 is shrunk, or contracted, by a predetermined amount (hereinafter called the shrinkage design) toward the central point M. The PCB land groups 120a through 120h are respectively defined as first to eighth PCB land groups 120a to 120h, and span from the left side to the right side of the substrate 110. Also, an anisotropic conductive film (ACF) 130 is attached to the upper surfaces of the PCB land groups 120a through 120h, and is used to connect the respective lands of the PCB land groups 120a-120h with the respective leads of the corresponding TCPs TCP1-TCP8.

The length of the printed circuit board 100 of particular interest herein is the right-to-left, or lateral distance from the right end of the eighth PCB land group 120h (corresponding to an eighth tape carrier package TCP 8) to the left end of the first PCB land group 120a (corresponding to a first tape carrier package TCP 1). Thus, the printed circuit board 100 of the present invention, together with the land groups 120 disposed thereon, (hereinafter referred to as a "shrinkage" printed circuit board) has a length that is shrunk, or contracted, when compared to the length of the conventional printed circuit board 30 of FIG. 2.

Figure 4:
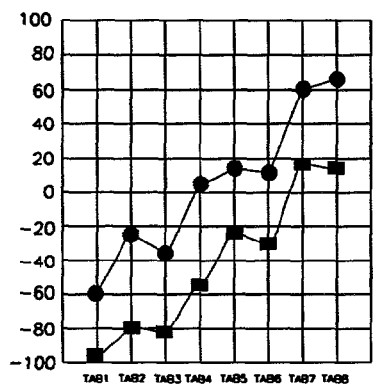
FIG. 4 is a group of four graphs illustrating the misalignment occurring in respective ones of four samples of a conventional printed circuit board at various temperatures.
Figure 4:
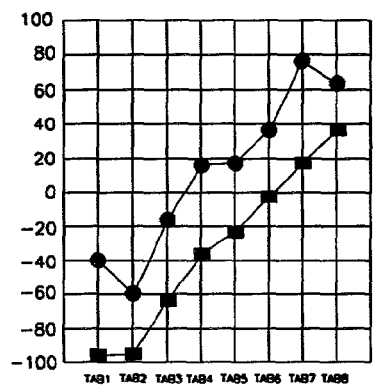
Figure 4:
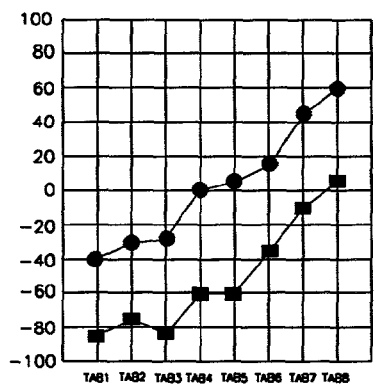
Figure 4:
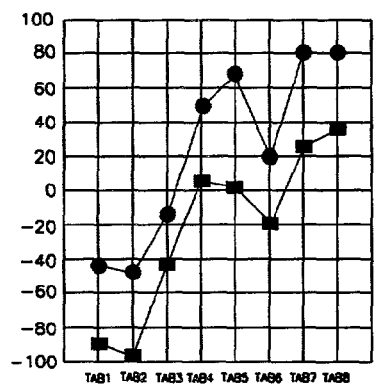

In accordance with one exemplary embodiment of the present invention, the amount that the shrinkage printed circuit board 100 is shrunk relative to the conventional PCB 30 is determined by the degree of misalignment of the land groups 120 occurring in the conventional printed circuit board 30 when a typical thermo-compression bonding process is applied thereto. For this purpose, a number of samples of a conventional printed circuit board 30 having a thickness of about 0.45 mm were thermo-compressed under a pressure of about 172 kg f/cm$^2$ for about 20 seconds, the degree of misalignment between each of the land groups 120 of each sample and its corresponding TCP was measured at the left and the right ends of each land group 120, and the measurements were tabulated, as shown in Table 1. In the above thermo-compression bonding process, Samples 1-4 were respectively bonded by the foregoing thermo-compression bonding method at temperatures of about 415° C., 405° C., 415° C. and 420° C., respectively. FIG. 4 illustrates graphs in which the results for each of the Samples 1-4 shown in Table 1 are respectively plotted.

TABLE 1

Degree of misalignment (μm) at each TCP of the conventional printed circuit board at various temperatures.

|  |  | TCP1 | TCP2 | TCP3 | TCP4 | TCP5 | TCP6 | TCP7 | TCP8 |
|---|---|---|---|---|---|---|---|---|---|
| Sample 1 | Left | −58 | −26 | −34 | 1 | 13 | 12 | 60 | 63 |
|  | Right | −96 | −81 | −83 | −53 | −23 | −29 | 13 | 12 |
| Sample 2 | Left | −39 | −61 | −14 | 14 | 17 | 38 | 77 | 66 |
|  | Right | −96 | −96 | −63 | −33 | −23 | −3 | 18 | 36 |
| Sample 3 | Left | −41 | −28 | −27 | −1 | 6 | 14 | 44 | 59 |
|  | Right | −88 | −74 | −85 | −58 | −59 | −30 | −10 | 3 |
| Sample 4 | Left | −44 | −46 | −13 | 52 | 57 | 21 | 81 | 81 |
|  | Right | −93 | −97 | −47 | 8 | 2 | −20 | 26 | 31 |

Figure 1:
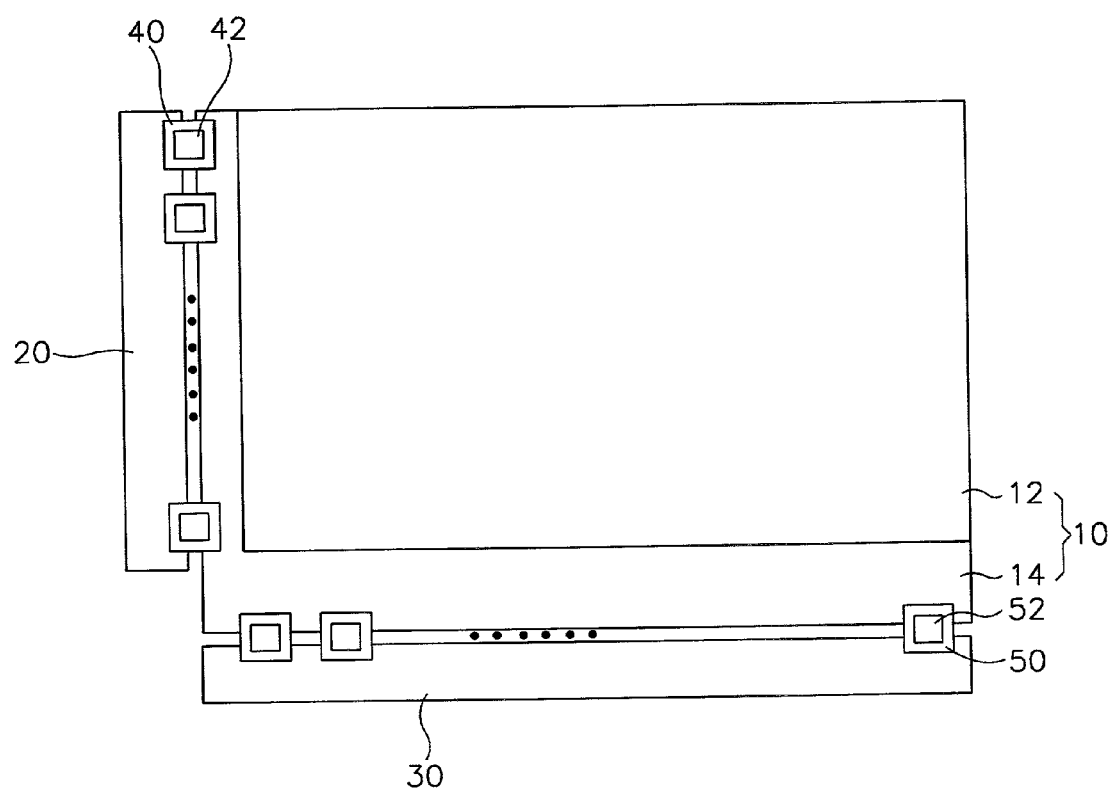
FIG. 1 is a plan view illustrating a liquid crystal display panel including a conventional printed circuit board and a tape carrier package attached to each other.
Figure 2:
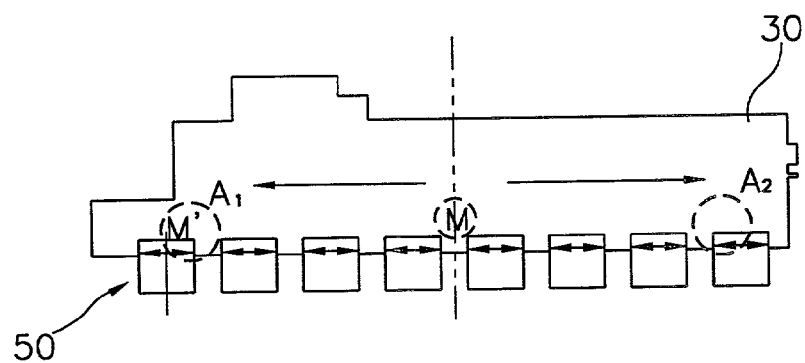
FIG. 2 is a plan view illustrating the directions of expansion of the conventional printed circuit board and the tape carrier package during thermo-compression bonding at a high temperature.

Referring to FIGS. 2 and 4 and Table 1, it may be seen that, in the conventional printed circuit board 30, the first TCP 50 and the eighth TCP 50 respectively experienced the greatest amount of lateral expansion due to thermal expansion of the substrate occurring during the thermo-compression process. Referring to FIG. 4, it may be seen that the degree of land group 120 to TCP lead group misalignment tends to increase toward the right upper ends of the graphs, and that the greatest amount of misalignment occurs at the left of the midpoint M dividing the printed circuit board into the two equal portions, rather than at the right of the point M. The reason for this difference is that the respective thermal reaction properties of the left and the right portions of the printed circuit board 30 are different from each other, since the conventional printed circuit board 30 is not symmetrical about the midline (phantom line of FIG. 2) passing through the midpoint M. In particular, the two portions of the PCB 30 respectively located on the left and right sides of the midpoint M have different vertical dimensions, and as a result, experience different amounts of lateral expansion during the thermo-compression bonding process. As those of skill in the art will appreciate, this difference in lateral expansion of the left and right sides of the PCB must be taken into account in order to accurately address the TCP-to-PCB mis-alignment problems described above. Accordingly, in the exemplary embodiments described herein, the left portion of the shrinkage printed circuit board 100 relative to the central point M is shrunk more than the right portion thereof so as to decrease the difference in the respective degrees of misalignment occurring in the left and right portions of the shrinkage PCB. Thus, when compared to the conventional PCB 30, the exemplary shrinkage PCBs 100 of the present invention have a length that is shrunk relative to that of the conventional PCB so as to prevent this misalignment. In detail, when compared to the conventional printed circuit board, an exemplary shrinkage printed circuit board 100 includes a shrunk left portion and a shrunk right portion, and the left portion is shrunk a greater amount than the right portion in order to prevent misalignment between the respective PCB land groups 120 and the lead groups of their corresponding TCPs.

Referring to Table 1 and FIG. 4, it may be seen that TCP 1 and TCP 8 experience the greatest amount of most misalignment relative to their corresponding land groups 120a and 120h, respectively. The respective amounts that the PCB land groups 120a and 120h need to be shrunk, or laterally shifted, with respect to the midpoint M in order to compensate for this misalignment can be determined from Table 1 and the graphs of FIG. 4. After the respective shrunk positions of the first and eighth land groups 120a and 120h have been so determined, the respective shrunk positions of the remaining land groups 120b through 120g of the shrinkage printed circuit board 100 can then be determined by positioning the remaining land groups at respective first and second intervals in each of the left and right portions of the shrinkage printed circuit board 100, based on the shifted positions of the first and eighth PCB land groups 120a and 120h respectively corresponding to TCP1 and TCP8, as described in more detail below.

According to Table 1, the average misalignment of the land groups at which TCP1 and TCP 8 are respectively located are −69.375 µm and 43.875 µm, respectively. Also, since the degree of misalignment in the left portion of the conventional printed circuit board 30 is greater than in the right portion of the printed circuit board, as shown in FIG. 4, the PCB land group 120a corresponding to TCP 1 is shifted right toward the midpoint M by about 66.5 µm, with a processing allowance of about 2.875 µm, and the PCB land group 120h corresponding to TCP 8 is shifted left toward the midpoint M by about 46.5 µm, with a processing allowance of about 2.125 µm. Thus, the shrinkage printed circuit board 100 has a length of interest dimension, i.e., the lateral distance from the left-most land of the left-most land group 120a to the right-most land of the right-most land group 120h, that is shrunk by about 112.5 µm in comparison with the corresponding dimension of the conventional printed circuit board 30, in order to prevent misalignment between the lands of the respective land groups 120a-120h and the corresponding leads of the TCPs during the thermocompression bonding operation.

Also, since the amount of thermal expansion of the left portion of the shrinkage printed circuit board 100 is greater than the amount of thermal expansion of the right portion thereof, which, as discussed above, is a result of the asymmetry of the shrinkage printed circuit board 100 about the vertical line passing through the midpoint M, the first intervals between adjacent PCB land groups 120 are set at 19 µm in the portion of the PCB to the left of the midpoint M, and at 13 µm in the portion of the PCB to the right of the midpoint M, based on the respective shifted positions of the first and the eighth land groups 120a and 120h, respectively.

Hence, in accordance with one exemplary embodiment of the present invention, in order to improve the TCP lead group to PCB land group misalignment problem of the conventional PCB 30, the dimensions of the intervals between the land groups of the conventional PCB are shrunk as shown in FIG. 3A and described above, so that the shrinkage printed circuit board 100 has a length of interest dimension that is shrunk by about 112.5 µm, as compared with the corresponding dimension of the conventional printed circuit board 30. Additionally, for purposes of simplicity in explication, and unless otherwise indicated by the context herein, the respective land groups of the PCB are referred to hereinafter simply as "lands," and the corresponding lead groups of the TCPs are referred to simply as "leads".

Referring to FIG. 3B, the lands of the TCP units 200 respectively corresponding to the PCB lands 120 are fixed at respective edge portions of the TFT substrate 300 by interposing the ACF 250 therebetween. The ACF 250 is the medium that electrically connects the leads of the TCP units 200 to the lands of the TFT substrate 300. The TCP units 200 thus correspond to respective ones of the PCB lands 120a through 120h and, starting at the left side of the figure, comprise first to eighth TCPs 200a through 200h.

Each of the TCPs 200a through 200h includes a driving IC 220 that is disposed at the central portion of a film comprising a light transmitting polyamide, and each TCP 200a through 200h includes input leads 230 and output leads 240. The input leads 230 connect the respective driving ICs 220 to the printed circuit board 100 by interposing the ACF 130 between the leads of the TCP and the lands of the PCB 100, and the output leads 240 connect the respective driving ICs 220 to the TFT substrate 300 by interposing the ACF 250 between the leads of the TCPs and the lands of the substrate 300.

In this embodiment, the respective output leads 240 of each of the TCPs 200a through 200h are first thermocompression bonded to corresponding lands on the TFT substrate 300, so that the TCPs are disposed at a first predetermined interval along the edge of the substrate. The input leads 230 of the TCPs 200a through 200h are then disposed on the ACF 250 attached to the corresponding PCB lands 120a through 120h of the shrinkage printed circuit board 100, which are spaced apart from one another at a second interval which is smaller than the first interval above. The leads of the TCPs 200a through 200h and the PCB lands 120a through 120h are then coupled to each other by the thermo-compression bonding process. During the thermocompression process, the shrinkage printed circuit board 100 experiences thermal expansion so that the respective lands 120a through 120h of each PCB is correctly aligned with a corresponding one of the input leads 230 of a corresponding one of the TCPs 200a through 200h after bonding.

For example, in one exemplary embodiment using the shrinkage printed circuit board 100 having the above-described shrunk, or contracted construction, the respective input leads 230 of the TCPs 200a through 200h are placed over the ACF 130 on the shrinkage printed circuit board 100 by utilizing a movable stage and a fixing member. At that time, the center of each PCB land 120a through 120h is laterally displaced relative to the center of its corresponding TCP by the amount that the land was shrunk, or laterally shifted, in the shrinkage printed circuit board before bonding, thereby forming a pre-compression state.

In this pre-compression state, the shrinkage printed circuit board 100 and the TCP units 200 are then attached to each other at a predetermined temperature under a predetermined pressure during the thermo-compression bonding process.

During the thermo-compression bonding process, the substrate 110 of the shrinkage PCB 100 expands laterally in response to its being heated, causing the PCB lands 120a through 120h respectively located on the left and right sides of the midpoint M of the PCB to move laterally toward the left and the right ends of the substrate 110, respectively, according to the thermal expansion of the substrate 110 to compensate for the respective amounts that each PCB land 120a through 120h was shrunk, or laterally shifted, when the shrinkage printed circuit board 100 was manufactured. Thus, the degree of misalignment between the respective leads 230 of the TCPs 200a-200h and the corresponding lands 120a-120h decreases during the thermo-bonding process, since each PCB land 120a through 120h expands so as to move into a more precise alignment with the lead of its corresponding TCP 200.

For verifying the accuracy of the alignment between the respective PCB lands and corresponding TCP leads resulting from the foregoing procedure, the misalignment occurring between the lands and corresponding TCP leads was measured by selecting ten shrinkage printed circuit boards 100 at random and putting them through the thermo-compression bonding process described above. Each shrinkage printed circuit board evaluated had a thickness of about 0.45 mm and was thermo-compressed at a temperature of about 175° C. under a pressure of about 3 MPa for about 20 seconds.

As discussed above, the left portion of the shrinkage printed circuit board 100 relative to the central point M expands with heating toward the left, and the right portion of the shrinkage printed circuit board 100 relative to the central point M expands with heating toward the right. However, the TCPs 200a through 200h each expand independently with heat, since, as discussed above, their respective output leads 240 are already fixed to the TPT substrate 300, so that a left portion of each TCP relative to its center expands to the left with heating and a right portion of each TCP relative to its center expands to the right. The direction of thermal expansion of the left end of each TCP and the direction of thermal expansion of the shrinkage printed circuit board 100 are the same as each other in the left portion of the shrinkage printed circuit board 100, but are different from each other in the right portion of the printed circuit board 100. Also, the direction of thermal expansion of the right end of each TCP and the direction of thermal expansion of the shrinkage printed circuit board 100 are different from each other in the left portion of the printed circuit board 100 and the same as each other in the right portion of the shrinkage printed circuit board 100. Therefore, individual misalignment occurs at the respective left and right ends of each of the TCPs 200a through 200h. Accordingly, in the ten sample shrinkage PCB 100 units that were evaluated, the misalignments of the left and right ends of the TCP units 200a through 200h were independently measured, and the results of those measurements are as shown in Table 2.

TABLE 2

Misalignment values (μm) measured at each TCP of the shrinkage printed circuit board

| | | TCP1 | TCP2 | TCP3 | TCP4 | TCP5 | TCP6 | TCP7 | TCP8 |
|---|---|---|---|---|---|---|---|---|---|
| Sample 1 | Left | −28 | −9 | −21 | 31 | 29 | 33 | 67 | 82 |
| | Right | −64 | −42 | −49 | −28 | −36 | −27 | 22 | 38 |
| Sample 2 | Left | 52 | 33 | 45 | 39 | 23 | 27 | 24 | 27 |
| | Right | −25 | −35 | −38 | −47 | −64 | −60 | −44 | −47 |
| Sample 3 | Left | 43 | 36 | 19 | −24 | −25 | −21 | 26 | 20 |
| | Right | −48 | −34 | −56 | −66 | −78 | −57 | −45 | −56 |
| Sample 4 | Left | 43 | 53 | 39 | 46 | 56 | 53 | 53 | 65 |
| | Right | −29 | 28 | −35 | 38 | 31 | 34 | 43 | 24 |
| Sample 5 | Left | 19 | 31 | −29 | 24 | −35 | 22 | 29 | 32 |
| | Right | −69 | −47 | −71 | −69 | −66 | −67 | −55 | −48 |
| Sample 6 | Left | −66 | −48 | −42 | −28 | −24 | −17 | 12 | 42 |
| | Right | −113 | −85 | −79 | −76 | −67 | −57 | −44 | −15 |
| Sample 7 | Left | 93 | 83 | 59 | 68 | 66 | 75 | 77 | 82 |
| | Right | 50 | 54 | 23 | 24 | −37 | 28 | 33 | 48 |
| Sample 8 | Left | 47 | 72 | 30 | 29 | 39 | 45 | 46 | 62 |
| | Right | −33 | −44 | −58 | −59 | −56 | −52 | −44 | −27 |
| Sample 9 | Left | 133 | 106 | 102 | 89 | 100 | 88 | 94 | 85 |
| | Right | 77 | 72 | 52 | 45 | 43 | 46 | 50 | 37 |
| Sample 10 | Left | 24 | 18 | −28 | −28 | 25 | 26 | −45 | 37 |
| | Right | −62 | −59 | −65 | −77 | −58 | −64 | −83 | −32 |

Referring to Table 2 and assuming both that the thermal expansion increases linearly and that the respective thermal expansions of the tape carrier packages 200a through 200h are constant, the total thermal expansion of the printed shrinkage printed circuit board 100 may be presumed to be the value taken from TCP8 minus the value taken from TCP1.

When the length of the shrinkage printed circuit board 100 is $l_0$ before the thermo-compression bonding process and the length of the shrinkage printed circuit board is $l$ after the thermocompression bonding process, the amount of thermal expansion per unit length is generally expressed by the following equation (1):

$$\frac{l - l_0}{l} \alpha \Delta t \quad (1)$$

In the above equation (1), α is the thermal expansion coefficient of the PCB 100 and ΔT is the difference between the initial temperature and the final temperature. The thermal expansion coefficient generally depends on the materials of the PCB when the temperature range is relatively small. Hence, the amount of thermal expansion of the shrinkage printed circuit board increases linearly with a constant rate at all the points of the initial length of the shrinkage printed circuit board and both ends of the shrinkage printed circuit board expand the most.

Also, the total amount of thermal expansion of each tape carrier package is assumed to have a constant value that is independent of the expansion of either the shrinkage printed circuit board 100 or the conventional printed circuit board 30 during the thermo-compression bonding process.

As shown in Table 3, the average amount of thermal expansion of each TCP is about 37.3 μm (with a standard deviation of 2) when the shrinkage printed circuit board 100 is thermo-compressed. Also, the average amount of thermal expansion of each TCP is about 42.17 μm (with a standard deviation of 0.988) when the conventional printed circuit board 30 is thermo-compressed, as shown in Table 7.

Under the above-mentioned assumptions, the sum of the magnitude of the measured thermal expansion displacement of the eighth TCP 200h and the magnitude of the measured thermal expansion displacement of the first TCP 200a, each of which is respectively located at an opposite end portion of the printed circuit board, is presumed to be the total amount of thermal expansion of the printed circuit board during thermo-compression. The validity of such presumption will be assessed with reference to FIGS. 5 and 6 below. Hereinafter, the left misalignment is measured based on each left end of each TCP and the right misalignment is measured based on each right end of each TCP.

Figure 5A:
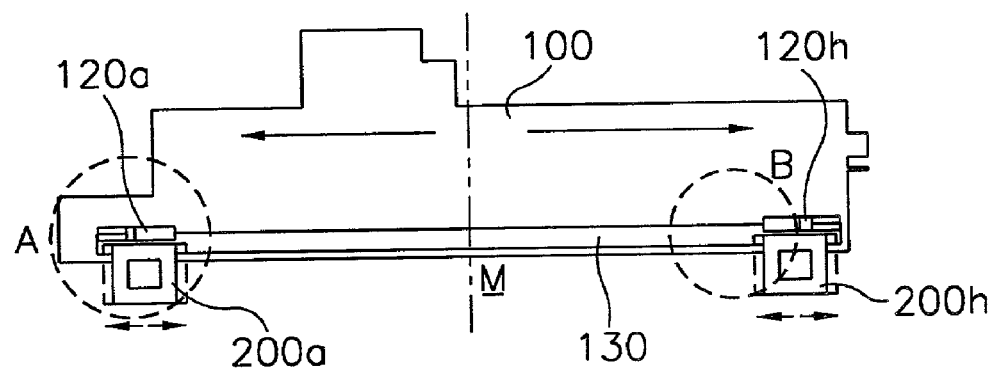
FIG. 5A is a plan view illustrating the thermal expansion of the shrinkage printed circuit board on the basis of the respective left ends of a first tape carrier package and an eighth tape carrier package according to the present invention.
Figure 5B:
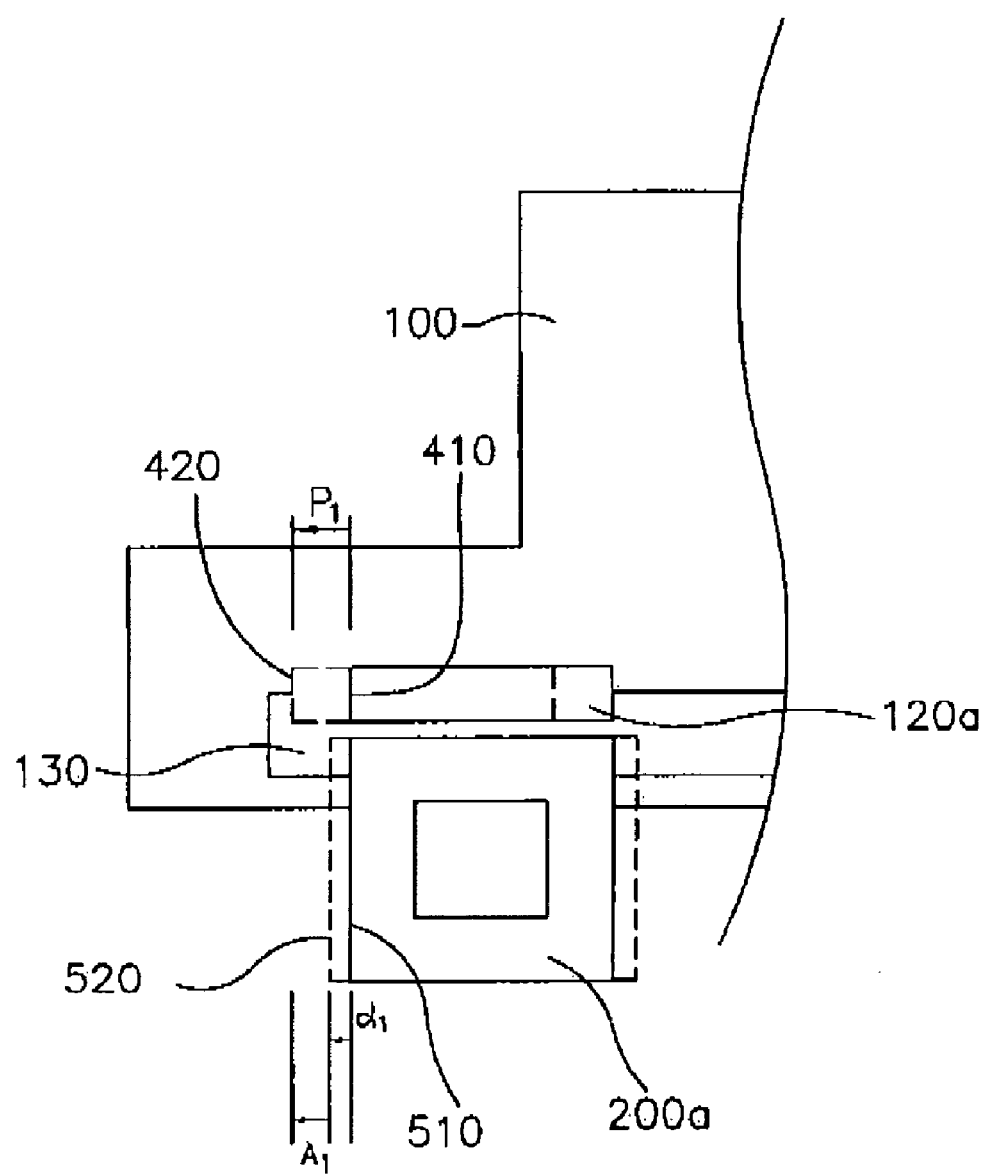
FIG. 5B is a partial plan view illustrating the measurement of misalignment in a region A of FIG. 5A.
Figure 5C:
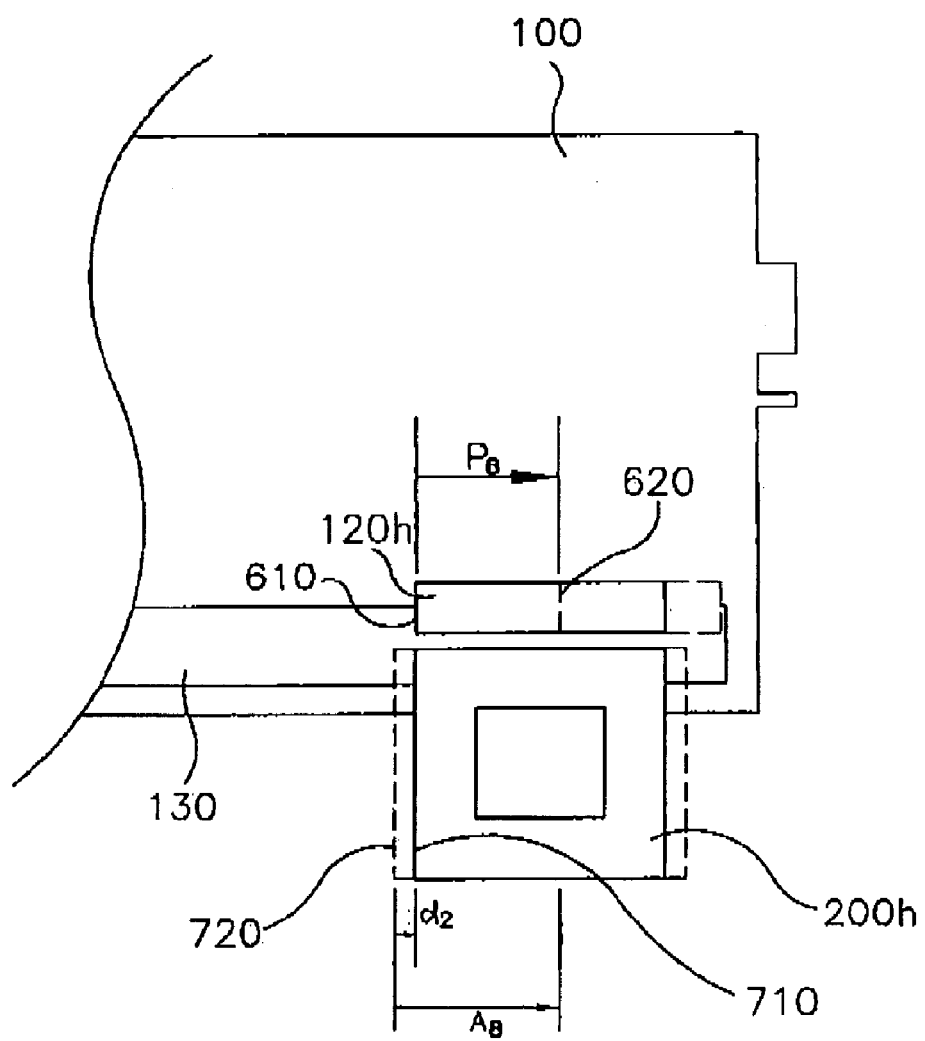
FIG. 5C is a partial plan view illustrating the measurement of misalignment in a region B of FIG. 5A.

FIGS. 5A, 5B and 5C are plan views illustrating the presumption that the total amount of thermal expansion of a printed circuit board 100 can be assessed based on the measured amounts of misalignment occurring at the left ends of the first TCP 200a and the eighth TCP 200h. The printed circuit board under consideration may be the shrinkage printed circuit board 100 or the conventional printed circuit board 30. As indicated by the arrows in FIG. 5A, the left portion of the printed circuit board expands with heating toward the left relative to the central point M, and she right portion of the printed circuit board 100 expands toward the right relative to the central point M. As above, the TCPs 200a through 200h expand independently with heating, since, as above, the output leads of the TCPs 200a through 200h are fixed to the TFT substrate 300, so that a left portion of each TCP expands toward the left relative to the center of the TCP with heating, and the right portion of each TCP expands toward the right relative to the center of the TCP, as indicated by the arrows in FIG. 5A.

Referring to FIG. 5A, the direction of expansion of the left end of the first TCP 200a is identical to the direction of expansion of the printed circuit board 100. However, the direction of expansion of the left end of the eighth TCP 200h is opposite to the direction of expansion of the printed circuit board 100. FIG. 5B is a partial plan view illustrating the measurement of the misalignment in the region A of FIG. 5A, and FIG. 5C is a partial plan view illustrating the measurement of the misalignment in the region 13 of FIG. 5A.

In FIG. 5B, a first real line 410 corresponds to the left end of the first PCB land 120a in the pre-compression state, and a second real line 510 corresponds to the left end of the corresponding lead of the first TCP 200a in the pre-compression state.

When the lead of the first TCP 200a and the first PCB land 120a are thermally compressed during the thermo-compression bonding process, the left end of the first PCB land 120a moves from the first real line 410 to the first dotted line 420 due to the thermal expansion of the substrate 110, and the left end of the lead of the first TCP 200a moves from the second real line 510 to the second dotted line 520 due to the thermal expansion of the first TCP 200a. Hence, during the thermo-compression bonding process, the left end of the lead of the first TCP 200a is displaced through an interval of a1 from the second real line 510 to the second dotted line 520. Also, the left end of the first PCB land 120a is displaced through an interval of $P_1$ from the first real line 410 to the first dotted line 420. Then, after the thermo-compression bonding process, the measured misalignment value becomes the displacement interval $A_1$ from the second dotted line 520 to the first dotted line 420. Therefore, the magnitude $|A_1|$ of the measured misalignment of the left end of the first TCP 200a lead and the left end of the first PCB land 120a is given by the following equation (2):

$$|A_1|=-P_1-(-\alpha1) \qquad (2)$$

Here, $P_1$ and α1 both have negative values, since P1 and α1 are displacements toward the left.

For example, in the Sample 1 measurements in Table 2, since the misalignment value of the left end of the first TCP 200a lead is −28 μm, the left end of the first PCB land 120a is positioned at a position that is offset from the left end of the first TCP 200a land by about 28 μm in the left direction after the thermal expansion of the substrate 110.

In FIG. 5C, the first real line 610 corresponds to the left end of the eighth PCB land 120h in the pre-compression state, and the second real line 710 corresponds to the left end of the lead of the eighth TCP 200h in the pre-compression state.

When the pre-compressed eighth TCP 200h lead and the eighth PCB land 120h are thermally compressed during the thermo-compression bonding process, the left end of the eighth PCB land 120h moves from the first real line 610 to the first dotted line 620 due to the thermal expansion of the substrate 110, and the left end of the eighth TCP 200h lead moves from the second real line 710 to the second dotted line 720 due to the thermal expansion of the eighth TCP 200h. Hence, during the thermo-compression bonding process, the left end of the eighth TCP 200h lead is displaced through an interval a2 from the second real line 710 to the second dotted line 720. The left end of the eighth PCB land 120h is also displaced through an interval of $P_8$ from the first real line 610 to the first dotted line 620. Also, after the thermo-compression bonding process, the measured misalignment value becomes the displacement interval $A_8$ from the second dotted line 720 to the first dotted line 620. Therefore, the magnitude $|A_8|$ of the misalignment measured at the left end of the eighth TCP 200h lead is given by the following equation (3):

$$|A_8|=P_8+(-\alpha2) \qquad (3)$$

Here, $P_8$ has a positive value and α2 has a negative value, since $P_8$ is a displacement toward the right and α2 is a displacement toward the left. Also, α2 is identical to α1, since, as above, the thermal expansion of the TCPs is assumed to be constant.

In Table 2, since the left misalignment value of the eighth TCP 200h lead is 82 μm, the left end of the eighth PCB land 120h is positioned at a position that is offset from the left end of the eighth TCP 200h lead by about 82 μm in the right direction after thermal expansion of the substrate 110.

The following equation (4) can be obtained from equation (2) and equation (4):

$$|A_8|+|A_1|=P_8-P_1 \qquad (4)$$

As illustrated by equation (4), the sum of the magnitudes of the misalignment values measured at the respective left ends of the first TCP 200a lead and the eighth TCP 200h lead may validly be regarded as the total amount of thermal expansion of the printed circuit board 100 occurring during the thermo-compression bonding process. Therefore, shrinking the shrinkage printed circuit board 100 by such total amount of thermal expansion in comparison with the conventional printed circuit board 30 will prevent misalignment between the shrinkage PCB lands and their corresponding TCP leads during the thermo-compression bonding process.

Figure 6A:
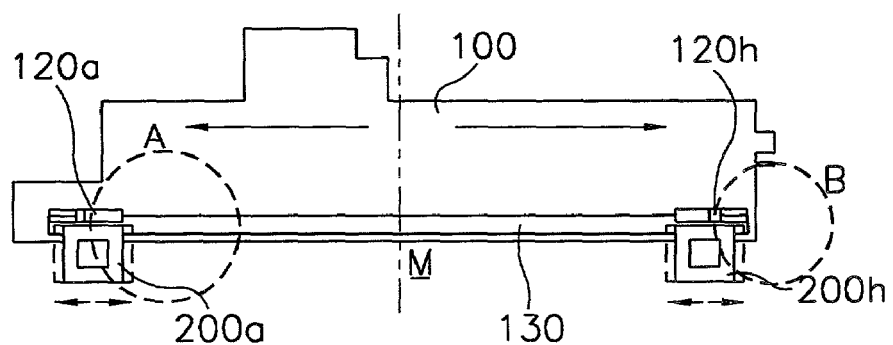
FIG. 6A is a plan view illustrating the thermal expansion of the shrinkage printed circuit board on the basis of the respective right ends of a first tape carrier package and an eighth tape carrier package according to the present invention.
Figure 6B:
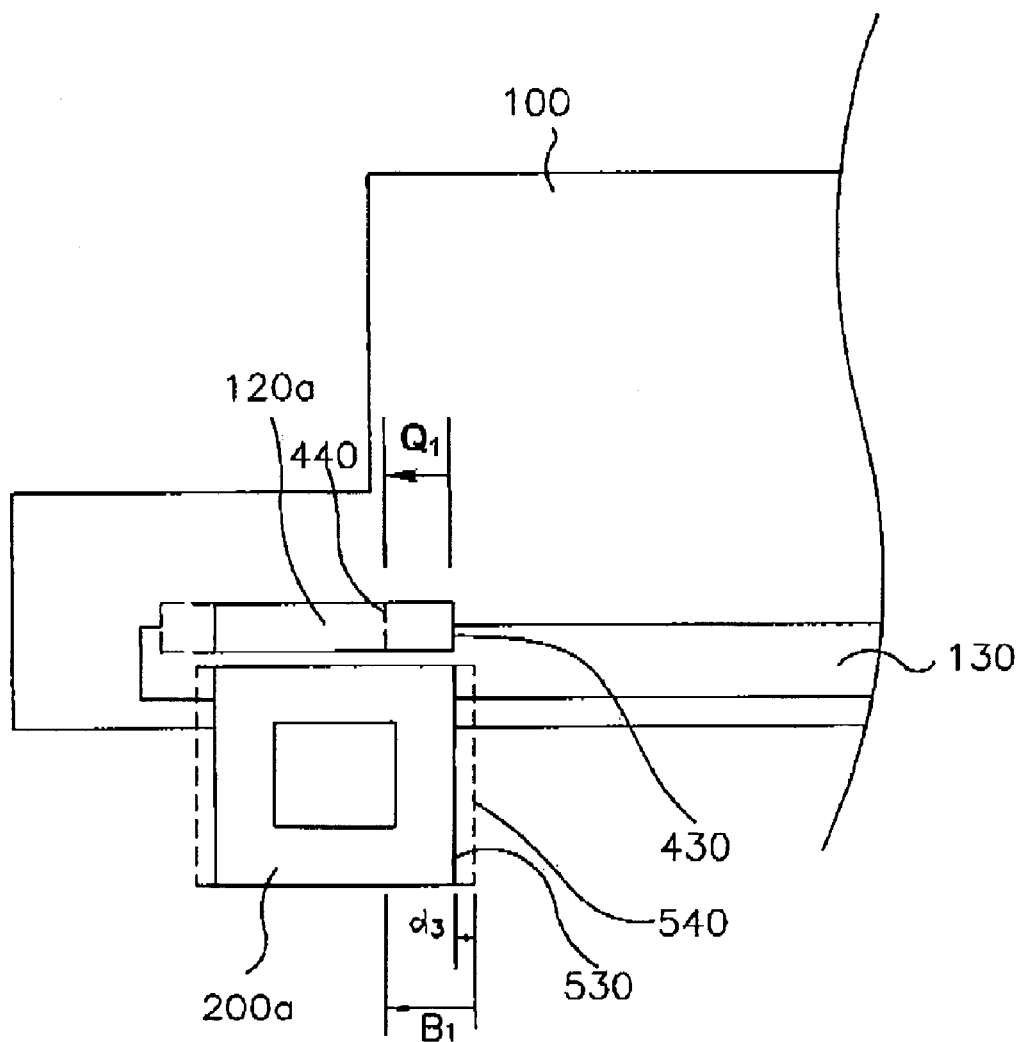
FIG. 6B is a partial plan view illustrating the measurement of the misalignment in a region A of FIG. 5A.
Figure 6C:
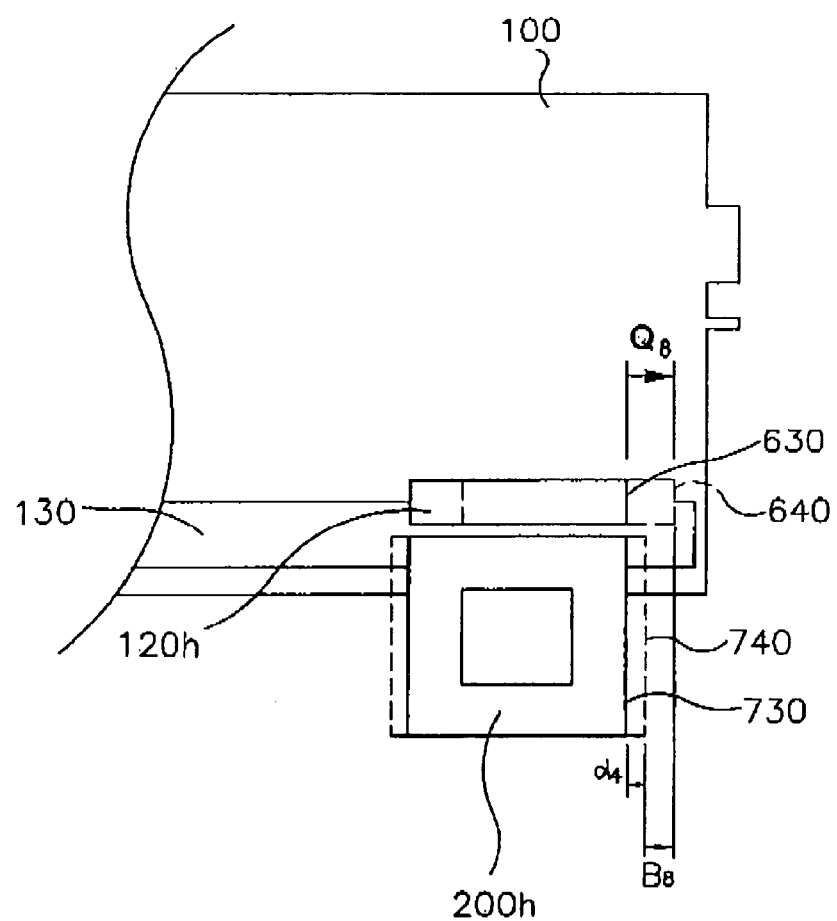
FIG. 6C is a partial plan view illustrating the measurement of the misalignment in a region B of FIG. 6A.

FIGS. 6A, 6B, and 6C are plan views illustrating the presumption that the total amount of thermal expansion of a printed circuit board 100 can also be assessed based on the measured amounts of misalignment occurring at the respective right ends of the first and eighth TCP units 200a and 200h. As indicated by the arrows in the figures, the left portion of the printed circuit board 100 with respect to the central point M is thermally expanded toward the left, and the right portion of the printed circuit board 100 with respect to the central point M is thermally expanded toward the right. Again, the TCPs 200a through 200h thermally expand independently, since, as described above, the output leads 240 of the TCPs 200a through 200h are already fixed to the TFT substrate 300, so that a left portion of each TCP expands coward the left relative to the center of the TCP, and the right portion of each TCP expands toward the right relative to the center of the TCP.

Referring to FIG. 6A, the direction of expansion of the right end of the first TCP 200a is opposite to the direction of expansion of the printed circuit board 100. However, the direction of expansion of the right end of the eighth TCP 200h is identical to the direction of expansion of the printed circuit board 100. FIG. 6B is a partial plan view illustrating the measurement of the misalignment in the region C of FIG. 6A, and FIG. 6C is a partial plan view illustrating the measurement of the misalignment in the region D of FIG. 6A.

In FIG. 6B, the first real line 430 corresponds to the right end of the first PCB land 120a in the pre-compression state, and the second real line 530 corresponds to the right end of the first TCP 200a lead in the pre-compression state.

When the pre-compressed first TCP 200a lead and the first PCB land 120a are thermally expanded during the thermo-compression bonding process, the right end of the first PCB land 120a moves from the first real line 430 to the first dotted line 440 due to the thermal expansion of the substrate 110, and the right end of the first TCP 200a lead moves from the second real line 530 to the second dotted line 540 due to the thermal expansion of the first TCP 200a. Hence, during the thermo-compression bonding process, the right end of the first TCP 200a lead is displaced through an interval of α3 from the second real line 530 to the second dotted line 540, and the right end of the first PCB land 120a corresponding to the first TCP 200a lead is displaced through an interval of $Q_1$ from the first real line 430 to the first dotted line 440. Then, after the thermo-compression bonding process, the measured misalignment value becomes the interval displacement $B_1$ from the second dotted line 540 to the first dotted line 440. Therefore, the magnitude $|B_1|$ of the misalignment measured at the right end of the first TCP 200a is given by the following equation (5):

$$|B_1|=-Q_1+(\alpha 3) \tag{5}$$

Here, Q1 has a negative value since Q1 is a displacement toward the left and α3 has a positive value since α3 is a displacement toward the right.

In Table 2, since the right misalignment value of the first TCP 200a lead is −64 μm, the right end of the first PCB land 120a is positioned at a position that is offset from the right end of the first TCP 200a lead by about 64 μm toward the left after thermal expansion of the substrate 110.

In FIG. 6C, the first real line 630 corresponds to the right end of the eighth PCB land 120h in the pre-compression state, and the second real line 730 corresponds to the right end of the eighth TCP 200h lead in the pre-compression state.

When the pre-compressed eighth TCP 200h lead and the eighth PCB land 120h corresponding to the eighth TCP 200h lead are thermally compressed during the thermo-compression bonding process, the right end of the eighth PCB land 120h moves from the first real line 630 to the first dotted line 640 due to the thermal expansion of the substrate 110, and the right end of the eighth TCP 200h lead moves from the second real line 730 to the second dotted line 740 due to the thermal expansion of the eighth TCP 200h. Hence, during the thermo-compression bonding process, the right end of the eighth TCP 200h lead is displaced through an interval of a4 from the second real line 730 to the second dotted line 740, and the right end of the eighth PCB land 120h is displaced through an interval of $Q_8$ from the first real line 630 to the first dotted line 640. Therefore, the magnitude $|B_8|$ of the misalignment measured at the right end of the eighth TCP 200h is given by the following equation (6):

$$|B_8|=Q_8-(\alpha 4) \tag{6}$$

Here, $P_8$ and α4 have positive values, since $P_8$ and α4 are displacements toward the right. Also, α4 is identical to α3, since the thermal expansion of the TCPs is assumed constant.

For example, in Table 2, since the right misalignment value of the eighth TCP 200h lead is 38 μm, the right end of the eighth PCB land 120h is positioned at a position that is offset from the right end of the eighth TCP 200h lead by about 38 μm toward the right after the thermal expansion of the substrate 110.

The following equation (7) can be obtained from equation (5) and equation (6):

$$|B_8|+|B_1|=Q_8-Q_1 \tag{7}$$

Thus, the sum of the magnitudes of the misalignment values measured at the respective right ends of the first TCP 200a and the eighth TCP 200h may also validly be regarded as the total amount of thermal expansion of the shrinkage printed circuit board 100 occurring during the thermo-compression bonding process. Therefore, shrinking the shrinkage printed circuit board 100 by such total amount of thermal expansion in comparison with the conventional printed circuit board 30 will also prevent misalignment of the PCB lands and their corresponding TCP leads during the thermo-compression bonding process.

Figure 7A:
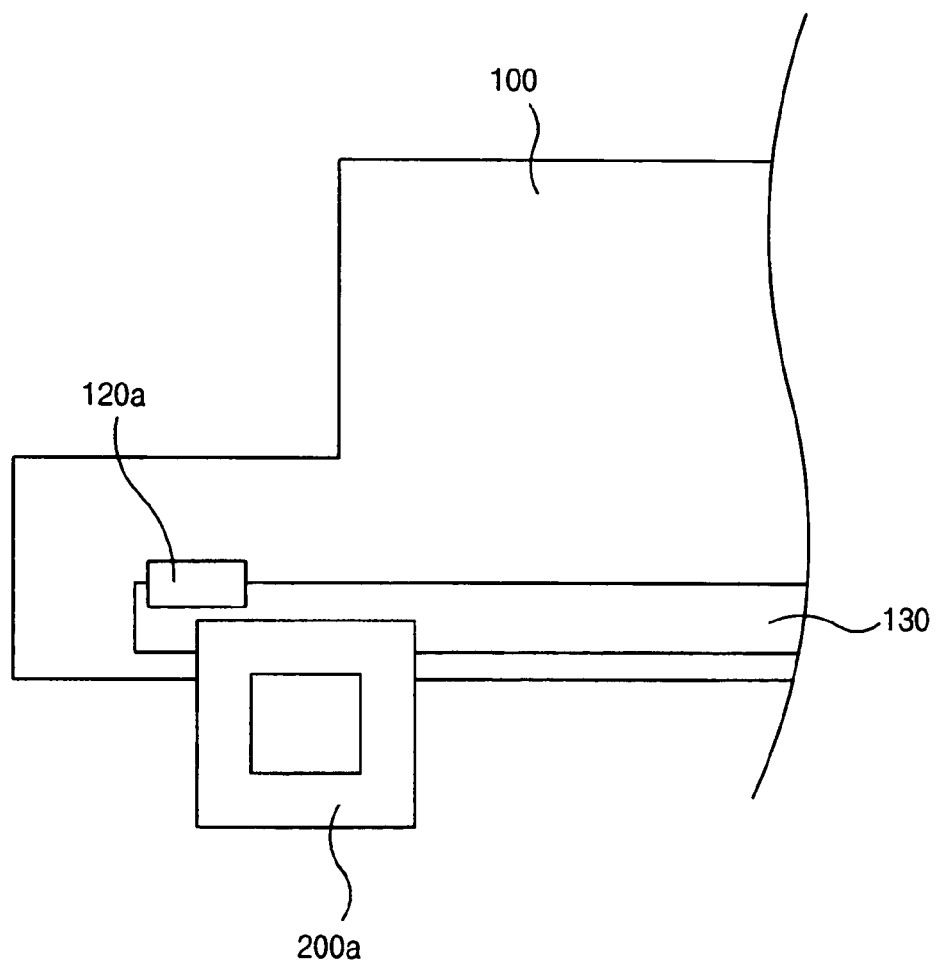
FIG. 7A is a partial plan view showing the state of alignment between a first printed circuit board land group and the corresponding lead group of a first tape carrier package after thermal expansion.
Figure 7B:
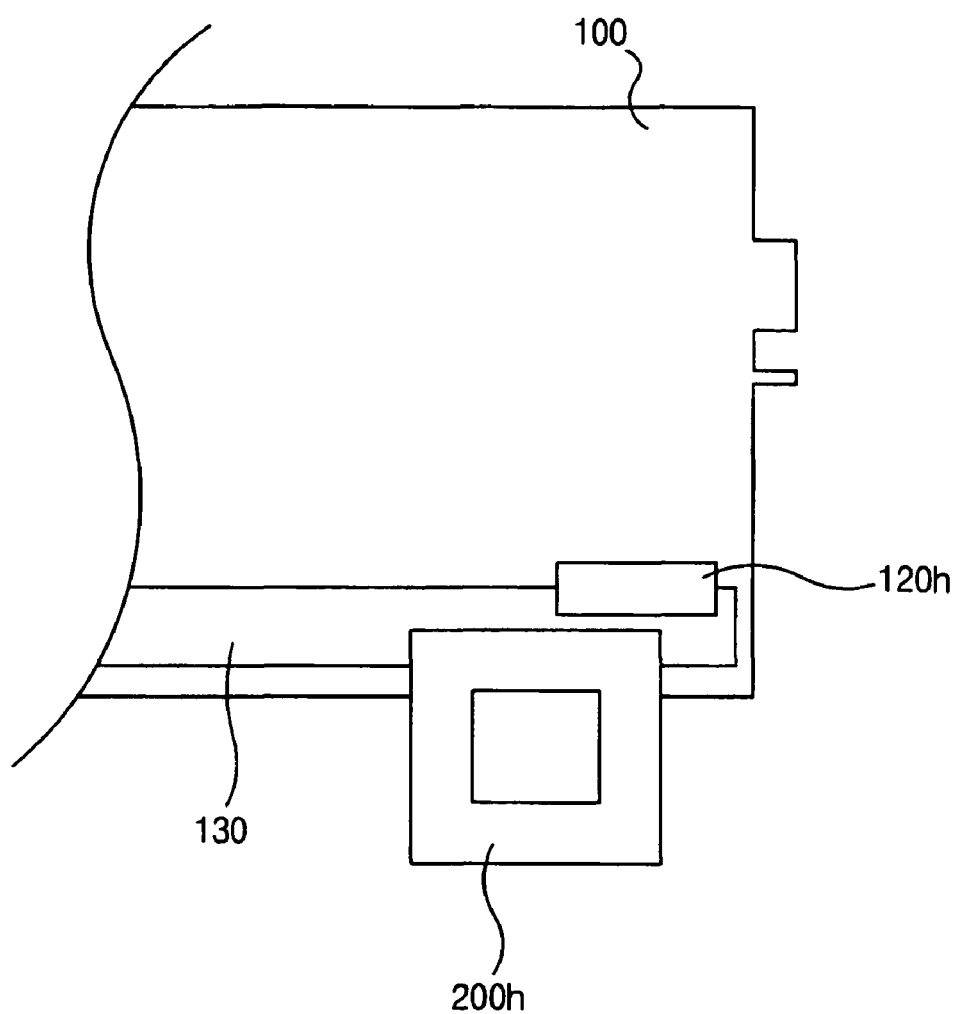
FIG. 7B is a partial plan view showing the state of alignment between an eighth printed circuit board land group and the corresponding lead group of an eighth tape carrier package after thermal expansion.

FIGS. 7A and 7B are partial plan views showing the relative positions of the respective PCB lands and the corresponding TCP leads of Sample 1 in Table 2 after the thermocompression bonding process. FIG. 7A is a partial plan view illustrating the state of alignment between the first PCB 120a land and the first TCP 200a lead, and FIG. 7B is a partial plan view showing the state of alignment between the eighth PCB land 120h and the eighth TCP 200h lead.

Referring to FIGS. 7A and 7B, the total amount of thermal expansion of the shrinkage printed circuit board TOO is directly obtained by summing the magnitude of the measured misalignment value of the eighth TCP 200h and the magnitude of measured misalignment value of the first TCP 200a.

However, although the total amount of thermal expansion occurring in the shrinkage printed circuit board is obtained as above, the amount of thermal expansion on the left of the TCP unit (see equation (4) above) differs from the amount of thermal expansion on the right of the TCP unit (see equation (7) above). For example, in the Sample 1 in Table 2, the amount of thermal expansion of the left of the TCP unit is 110 μm, whereas, the amount of thermal expansion on the right of the TCP unit is 102 μm. Due to the asymmetry of the shrinkage printed circuit board 100 about the midpoint M discussed above, the minute differences in the spacing between the TCP units 200, presumed above to have an identical value, and the difference among the thermal reaction properties of the TCP units caused by processing errors may nevertheless generate some differences in the respective amounts of thermal expansion.

Consequently, the thermal expansion amounts of each sample in Table 2 can be presumed according to the equations (4) and (7), and the presumed thermal expansion amounts are shown at column A in Table 3.

TABLE 3 presumed thermal expansion (μm) of the shrinkage printed circuit board and the misalignment amount (μm) of the shrinkage printed circuit board according to the presumed thermal expansion.

| | | A | B | C | D | E | F |
|---|---|---|---|---|---|---|---|
| Sample 1 | Left | 110 | 277114 | 92 | 18 | 9 | 130 |
| | Right | 102 | | | 10 | 5 | 122 |
| Sample 2 | Left | −25 | 277020 | −2 | −23 | −12 | 89 |
| | Right | −22 | | | −20 | −10 | 92 |
| Sample 3 | Left | −23 | 277015 | −7 | −16 | −8 | 96 |
| | Right | 8 | | | 1 | 1 | 111 |
| Sample 4 | Left | 22 | 277008 | −14 | 36 | 18 | 148 |
| | Right | 53 | | | 67 | 34 | 179 |
| Sample 5 | Left | 13 | 277020 | −2 | 15 | 8 | 127 |
| | Right | 21 | | | 23 | 12 | 135 |
| Sample 6 | Left | 108 | 277084 | 62 | 46 | 23 | 158 |
| | Right | 98 | | | 36 | 18 | 148 |
| Sample 7 | Left | −11 | 277013 | −9 | −2 | −1 | 110 |
| | Right | −2 | | | 7 | 4 | 119 |
| Sample 8 | Left | 15 | 277020 | −2 | 17 | 9 | 129 |
| | Right | 6 | | | 8 | 4 | 120 |
| Sample 9 | Left | −48 | 276967 | −55 | 7 | 4 | 119 |
| | Right | −40 | | | 15 | 8 | 127 |
| Sample 10 | Left | 13 | 277020 | −2 | 15 | 8 | 127 |
| | Right | 30 | | | 32 | 26 | 144 |

Meanwhile, since the conventional printed circuit board is designed with a standard length of 277134 μm after the standardized process, the shrinkage printed circuit board 100 having the respective positions of the PCB land groups shrunk by 112.5 μm has a standard length of 277022 μm after the above standardizing process in comparison with the conventional printed circuit board. Hereinafter, the shrinkage printed circuit board will be referred to as the standard printed circuit board when the shrinkage printed circuit board has undergone the standardizing process.

The measured lengths of the shrinkage printed circuit boards 100 for experiment are shown at column B in Table 3 and the length deviations of the PCBs are presented by taking the standard length from the measured length of the shrinkage printed circuit boards 100 at column C in Table 3.

In general, the length deviation of the PCB is known to affect the misalignment regarding the shrinkage design. Therefore, a PCB allowance control is required in the range of ±70 μm concerning a product having a pitch of above 400 μm, and a PCB allowance control is required in the range of ±50 μm concerning a product having a pitch of below 400 μm. Hence, Sample 1 is deviated from the allowance, judging from the basis of the PCB allowance having the above range.

The thermal expansion amounts of the shrinkage printed circuit board 100 are presented at column D in Table 3 after the length deviations of the PCB are amended. The length deviations of the PCB numerically affect the misalignment. So, the value obtained by taking the length deviations in column C from the expansion amounts in column A results in the total amount of thermal expansion of the shrinkage printed circuit board 100, when the shrinkage printed circuit board 100 for each sample has a standardized length.

Also, the shrinkage printed circuit board 100 can be treated as it has the length deviation of about 112.5 μm comparing with the conventional printed circuit board so that the presumed amount of thermal expansion can be obtained about the conventional printed circuit board when the initial shrinkage amount of 112.5 μm is added to the total expansion amount at column D. Such presumed amounts of thermal expansion are presented at column E in Table 3.

In the meantime, when the standard shrinkage printed circuit board is thermo-compressed, the misalignment that is dependent only on the thermal expansion of the printed circuit board corresponds to the value obtained by halving the total amount of thermal expansion, neglecting deviation of the instruments, expansion of the tape carrier package and other factors. The reason for this is that the thermal expansion of the printed circuit board occurs in the left and the right directions centering around the central point M. The misalignment values of the shrinkage printed circuit board 100 having the standard length are shown at column E in Table 3.

Therefore, when the shrinkage printed circuit board 100 of the present embodiment is thermo-compressed, the standard deviation is about 2.64 and an average misalignment of 7.9 μm occurs. Also, if the conventional standard printed circuit board is not shrunk, the average amount of thermal expansion becomes the about 127 μm expansion amount shown in column D. Such presumed amounts of thermal expansion are presented at column E in Table 3.

Meanwhile, in order to compare the improvement in misalignment generated in the shrinkage printed circuit board 100, the misalignment values were measured at the left and the right ends of the TCPs after sampling the conventional printed circuit boards 30. Such experiments were performed on 5 conventional printed circuit boards. The composition and the thickness of the conventional printed circuit board were identical to those of the shrinkage printed circuit board, and the processing conditions were also identical to those described above, and the signs indicating direction of expansion of the conventional printed circuit board are also identical to those for the shrinkage printed circuit board. The measured misalignment values resulting from the experiment are shown in the following Table 4.

TABLE 4

The misalignment values (μm) measured at each TCP of the conventional printed circuit board

| | | TCP1 | TCP2 | TCP3 | TCP4 | TCP5 | TCP6 | TCP7 | TCP8 |
|---|---|---|---|---|---|---|---|---|---|
| Sample 1 | Left | −34 | −29 | −30 | −21 | −25 | −26 | 33 | 42 |
| | Right | −88 | −59 | −62 | −71 | −66 | −63 | −54 | −50 |
| Sample 2 | Left | −68 | −66 | −53 | −47 | −33 | 35 | 46 | 45 |
| | Right | −110 | −101 | −85 | −84 | −78 | −50 | −39 | −49 |
| Sample 3 | Left | −44 | −42 | −41 | −30 | −16 | 31 | 27 | 53 |
| | Right | −83 | −79 | −67 | −67 | −69 | −54 | −48 | −39 |
| Sample 4 | Left | −67 | −61 | −30 | −48 | −39 | −35 | −22 | 33 |
| | Right | −111 | −108 | −69 | −81 | −83 | −77 | −71 | −53 |
| Sample 5 | Left | −55 | −48 | −39 | −29 | 26 | 37 | 34 | 35 |
| | Right | −103 | −89 | −72 | −72 | −64 | −53 | −52 | −57 |

The value obtained by summing the magnitude of the misalignment value of TCP 1 and the magnitude of the misalignment value of TCP 8 is presumed as the total amount of thermal expansion of the conventional printed circuit board such as the shrinkage printed circuit board. The calculated misalignment amounts of the conventional printed circuit board are presented in Table 5 based on the measured misalignment values in Table 4.

TABLE 5 presumed thermal expansion (μm) of the conventional printed circuit board and the misalignment amount (μm) of the conventional printed circuit board according to the presumed thermal expansion.

| | | A | B | C | D | E |
|---|---|---|---|---|---|---|
| Sample 1 | Left | 76 | 277058 | −76 | 152 | 76 |
| | Right | 38 | | | 114 | 57 |
| Sample 2 | Left | 113 | 277104 | −30 | 143 | 72 |
| | Right | 61 | | | 91 | 46 |

TABLE 5-continued presumed thermal expansion (μm) of the conventional printed circuit board and the misalignment amount (μm) of the conventional printed circuit board according to the presumed thermal expansion.

|          |       | A   | B      | C   | D   | E  |
|----------|-------|-----|--------|-----|-----|----|
| Sample 3 | Left  | 97  | 277091 | −43 | 140 | 70 |
|          | Right | 50  |        |     | 93  | 47 |
| Sample 4 | Left  | 100 | 277089 | −45 | 145 | 73 |
|          | Right | 58  |        |     | 103 | 52 |
| Sample 5 | Left  | 90  | 277096 | −38 | 128 | 64 |
|          | Right | 46  |        |     | 84  | 42 |

In Table 5, column A lists the amounts of thermal expansion of the conventional printed circuit board presumed from the measured misalignment values in Table 4, and column B lists the measured lengths of the samples utilized during the experiment. Column C lists the values obtained by taking the standard length of the conventional printed circuit board (that is, 277134 μm) from the measured lengths, and represents the length deviations of the conventional printed circuit board.

Hence, the amounts of thermal expansion amended by the length deviations of the PCB about the samples of the conventional printed circuit board correspond to the values obtained by taking the values of the column C from the values of column A. Such presumed thermal expansion amounts are shown at column D in Table 5, and as indicated therein, the conventional printed circuit board expands by the average amount of thermal expansion of 119 μm, with a standard deviation of 25.4.

The misalignments due to the thermal expansion of the conventional printed circuit board 30 are presented at column E in Table 5. Since the thermal expansion of the conventional printed circuit board occurs in the left and the right directions centering around the midpoint M thereof, the respective amounts of misalignment correspond to one half of the presumed amounts of thermal expansion listed in column D, and the average misalignment amount is about 60 μm, with a standard deviation of 4.0.

Therefore, if the amount of misalignment due to the thermal expansion of the shrinkage printed circuit board 100 of the present embodiment in Table 3 is compared with the amount of misalignment due to the thermal expansion of the conventional printed circuit board 30 in Table 5, the decrease in misalignment resulting in the present embodiment can be clearly verified.

According to the present embodiment, the decrease in misalignment is verified at a temperature of 175° C. But, of course, the decrease in misalignment should be verified in the range of temperatures in which the thermal expansion of the printed circuit board was generated. An epoxy, with which the printed circuit board is made, is generally transformed into a glass at a temperature about 140° C. (the transition temperature of the PCB), and therefore, the decrease in misalignment should always be verified in a thermo-compression bonding process performed at a temperature that is higher than the transition temperature of the PCB. However, at a temperature greater than 200° C., adhesive force is remarkably lowered because of an over-hardness characteristic of the ACE film. Consequently, the decrease in the misalignment may be conspicuously verified in a range of temperature between 140° C. and 200° C.

Figure 8A:
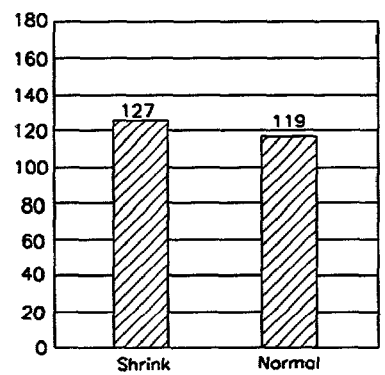
FIG. 8A is a graph comparing experimental data of the shrinkage printed circuit board with experimental data of the conventional printed circuit board.
Figure 8B:
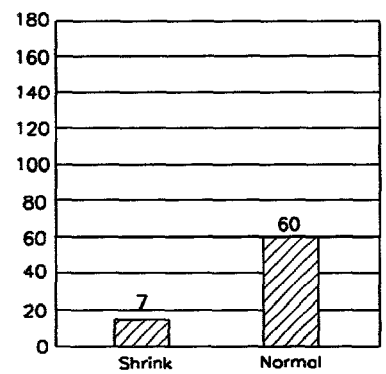
FIG. 8B is a graph comparing experimental data of the misalignment of the shrinkage printed circuit board due to thermal expansion with experimental data of the misalignment of the conventional printed circuit board due to thermal expansion.
Figure 9C:
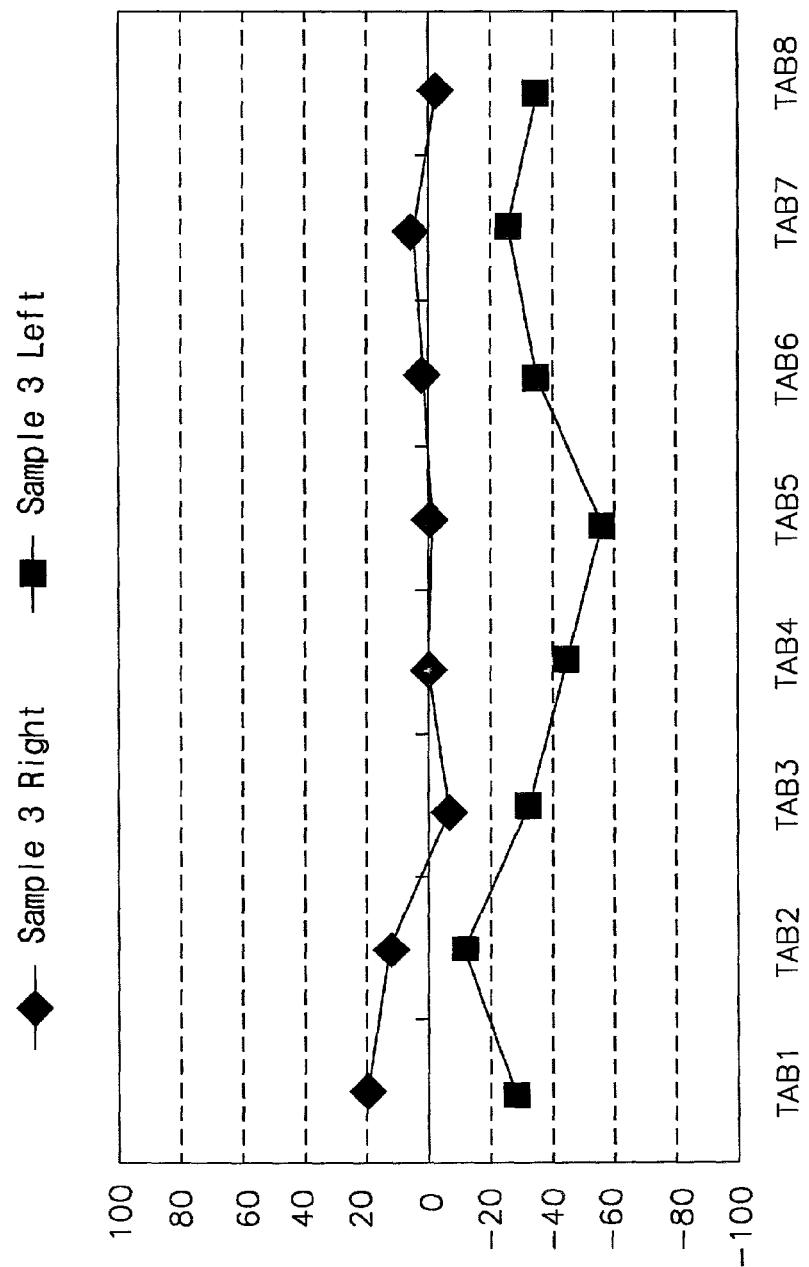
Figure 9D:
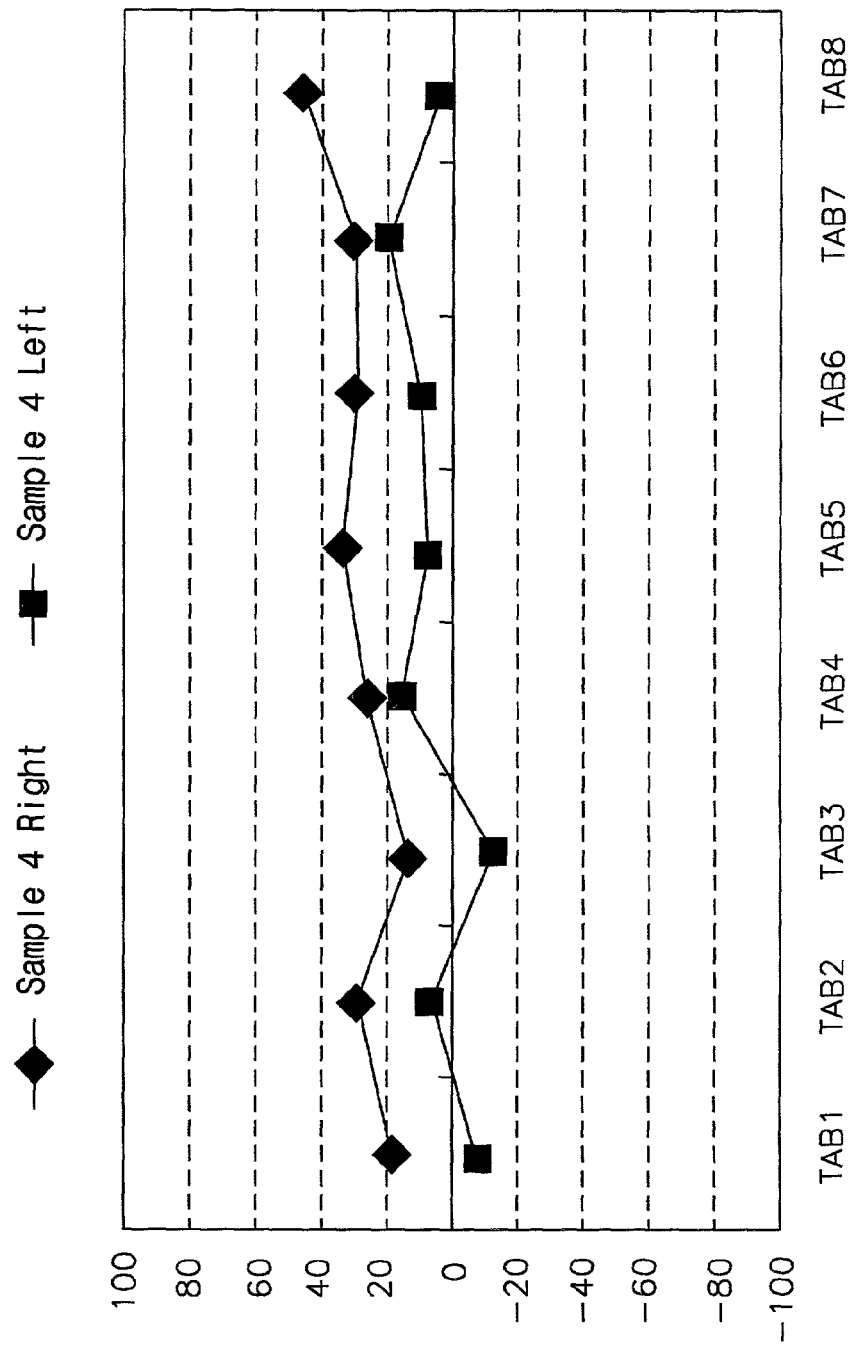
Figure 9F:
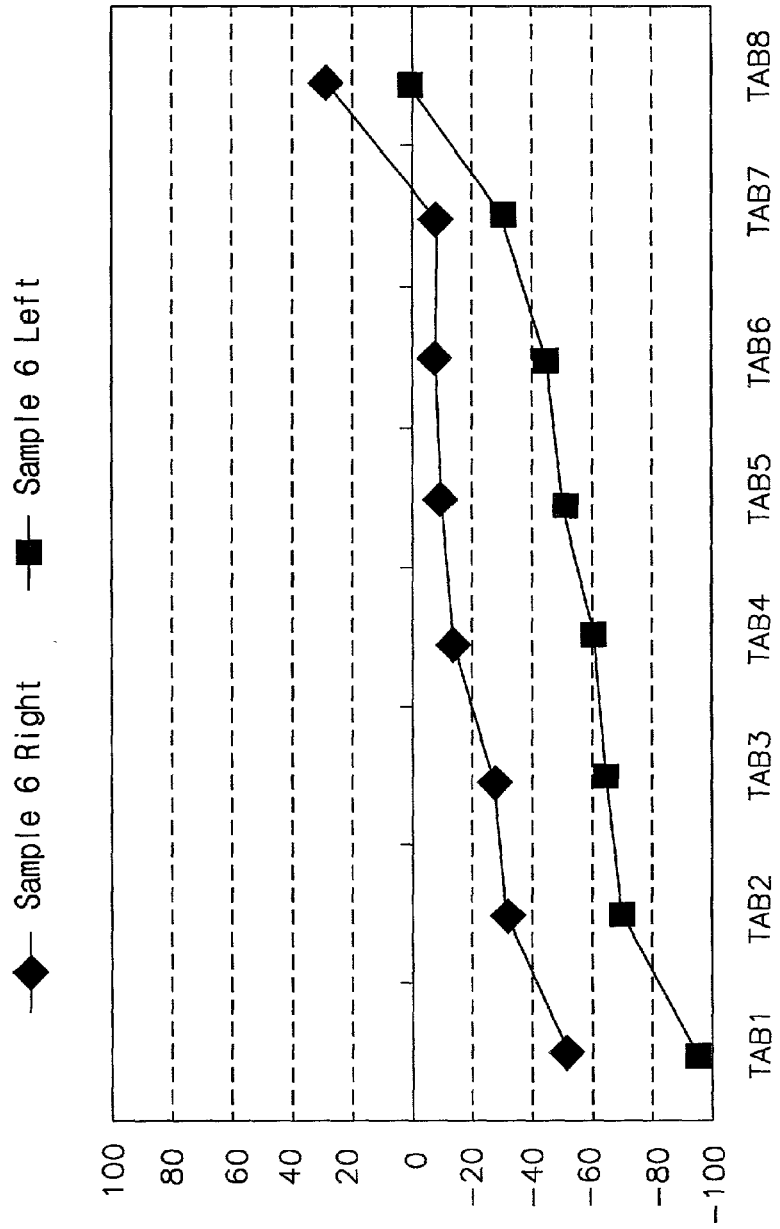
Figure 10A:
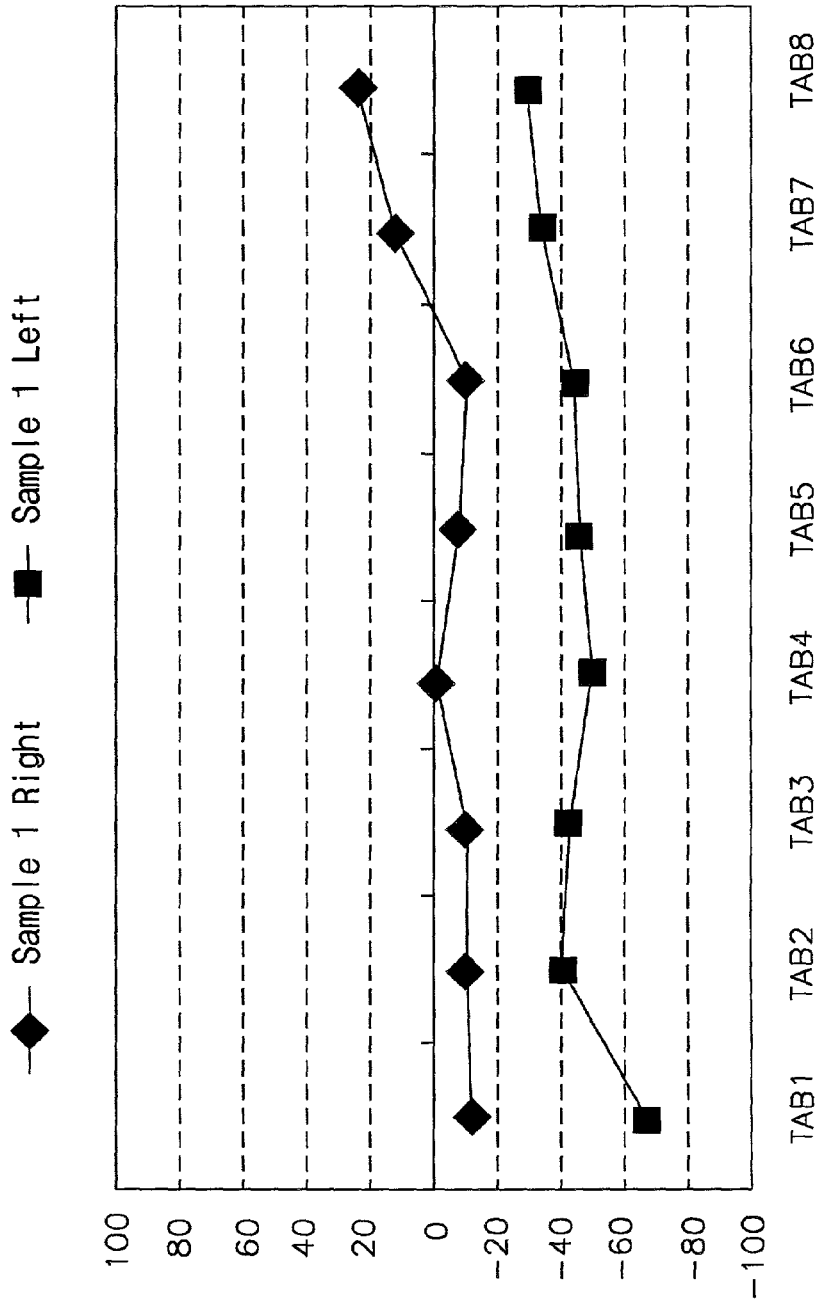
Figure 11:
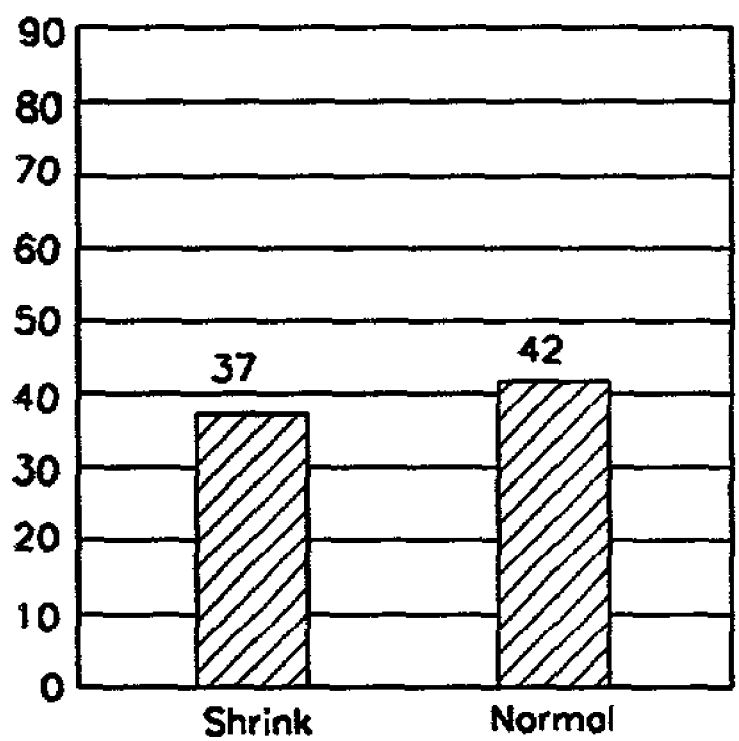
FIG. 11 is a graph comparing the thermal expansion of each tape carrier package of the shrinkage printed circuit board with the thermal expansion of each tape carrier package of the conventional printed circuit board.

FIGS. 8A and 8B are graphs comparing the experimental data of the shrinkage printed circuit board 100 of the present invention with the experimental data of the conventional printed circuit board 30. FIG. 8A is a graph comparing the total amount of thermal expansion of the shrinkage printed circuit board of the present invention with the total amount of thermal expansion of the conventional printed circuit board. FIG. 8B is a graph comparing the amount of misalignment resulting in the shrinkage printed circuit board of the present invention with the amount of misalignment resulting in the conventional printed circuit board.

Referring to FIG. 8A, column D in Table 5 and column A in Table 3, the average total amount of thermal expansion of the conventional printed circuit board 30 is about 119 μm, and the average total amount of thermal expansion of the shrinkage printed circuit board 100 is about 127 μm, so it may be seen that the total amount of thermal expansion in both printed circuit is similar. Hence, it is confirmed that the shrinkage of the substrate 110 length does not have much affect on the thermal expansion of the substrate.

However, referring to FIG. 8B, column D in Table 5 and column A in Table 3, the improvement in the misalignment due to the thermal expansion of the substrate can be can be confirmed. While the average amount of misalignment in the conventional standard printed circuit board is 60 μm, the average amount of misalignment in the shrinkage standard printed circuit board is 7.9 μm, thus verifying the substantial improvement in the misalignment occurring in the shrinkage standard printed circuit board according to the present invention.

Meanwhile, the amount of thermal expansion of the printed circuit board is accumulated toward both the left and right end portions of the printed circuit board, so the amount of misalignment generated is correspondingly increased toward both left and right end portions of the printed circuit board. Such characteristic has already been identified above as the increasing inclinations toward the right ends in the graphs of FIG. 4.

In the exemplary shrinkage printed circuit board 100 of the present invention, the intervals between the adjacent PCB land groups 120a to 120h respectively located at the left and the right portions of the substrate 110 centering around the central, or midpoint M are arranged so as to be different from one another, thereby maintaining the amount of misalignment generated in each of TCPs 200a through 200h constant. The amount of this constant misalignment is obtained in the following manner utilizing the measured data in Tables 2 and 4.

In Table 2, the amount of misalignment is measured on the basis of each edge of TCPs 200a through 200h for convenience of measurement. However, the precise amount of misalignment should be measured on the basis of each PCB land group 120a through 120h and the center of each corresponding lead group of TCPs 200a through 200h because misalignment here means an irregularity among the respective conductive patterns (i.e., a misalignment between respective PCB land groups 120 and corresponding TCP 200 lead groups) that are used for exchanging the electrical signals between the printed circuit board 100 and the tape carrier packages 200.

Therefore, after the respective widths of each PCB land group 120a through 120h and the corresponding lead group of each TCP 200a through 200h are measured, the calculated misalignment values on the basis of the center of the lead group of each TCP 200a through 200h are presented in Table 7. In the samples of the shrinkage printed circuit board 100 that were measured, the measured width of each PCB land group 120a to 120h and the measured width of each TCP lead group 200a to 200h are shown in the following Table 6.

TABLE 6

The widths (μm) of the PCB land and the TCP lead of the shrinkage printed circuit board

|  | measured width of land (a) | width of lead (b) | (a − b)/2 |
|---|---|---|---|
| Sample 1 | 195 | 170 | 12.5 |
| Sample 2 | 215 |  | 22.5 |
| Sample 3 | 215 |  | 22.5 |
| Sample 4 | 215 |  | 22.5 |
| Sample 5 | 220 |  | 25 |
| Sample 6 | 200 |  | 15 |
| Sample 7 | 220 |  | 25 |
| Sample 8 | 220 |  | 25 |
| Sample 9 | 220 |  | 25 |
| Sample 10 | 215 |  | 22.5 |

As shown in Table 6, the measured width of each land group is obtained by measuring the real width of the PCB land group of each sample and the width of the lead group is obtained by measuring the real width of the lead group of the corresponding TCP of each sample. The widths of the respective lead groups were found to vary only minutely, so that the respective widths of the lead groups can be treated as constants for all of the samples.

Thus, although the difference between the measured width of a land group and the width of the corresponding lead group (hereinafter, the width difference) is a quantity having no connection with the misalignment, the width difference is included in the measured misalignment value in Table 2. The measured misalignment values in Table 2 are obtained on the basis of each TCP 200*a* through 200*h*, and that each TCP 200*a* through 200*h* is thermally expanded in the left and the right directions centering around the central point M' dividing each TCP 200*a* through 200*h* into two portions in the lengthwise direction of each TCP 200*a* through 200*h*. Accordingly, two halves of the width difference are respectively included in the left and the right portions of each TCP 200*a* through 200*h* centering around the point M'.

The value obtained by halving the width difference from the measured misalignment value corresponds to the misalignment value generated on the basis of the center of each TCP 200*a* through 200*h*. In Table 2, half the width difference is added to the measured misalignment value in the left direction and half the width difference is taken from the measured misalignment value in the right direction, so the absolute misalignment value is reduced by half the width difference compared with the measured misalignment value in Table 2. The calculated misalignment values on the basis of the center of the shrinkage printed circuit board obtained by the above method are shown in Table 7.

TABLE 7 the misalignment values (μm) on the basis of the center of the shrinkage printed circuit board

|  |  | TCP1 | TCP2 | TCP3 | TCP4 | TCP5 | TCP6 | TCP7 | TCP8 |
|---|---|---|---|---|---|---|---|---|---|
| Sample 1 | Left | −16 | 4 | −9 | 19 | 17 | 21 | 55 | 70 |
|  | Right | −52 | −30 | −37 | −16 | −24 | −15 | 10 | 26 |
| Sample 2 | Left | 30 | 11 | 23 | 17 | 1 | 5 | 2 | 5 |
|  | Right | −3 | −13 | −16 | −25 | −42 | −38 | −22 | −25 |
| Sample 3 | Left | 21 | 14 | −4 | −2 | −3 | 2 | 4 | −3 |
|  | Right | −26 | −12 | −34 | −44 | −56 | −35 | −23 | −34 |
| Sample 4 | Left | 21 | 31 | 17 | 24 | 34 | 31 | 31 | 43 |
|  | Right | −7 | 6 | −13 | 13 | 9 | 12 | 21 | 2 |
| Sample 5 | Left | −6 | 6 | −4 | −1 | −10 | −3 | 4 | 7 |
|  | Right | −44 | −22 | −46 | −44 | −41 | −42 | −30 | −23 |

TABLE 7-continued the misalignment values (μm) on the basis of the center of the shrinkage printed circuit board

|  |  | TCP1 | TCP2 | TCP3 | TCP4 | TCP5 | TCP6 | TCP7 | TCP8 |
|---|---|---|---|---|---|---|---|---|---|
| Sample 6 | Left | −51 | −33 | −27 | −13 | −9 | −2 | −3 | 27 |
|  | Right | −98 | −70 | −64 | −61 | −52 | −42 | −29 | 0 |
| Sample 7 | Left | 68 | 58 | 34 | 43 | 41 | 50 | 52 | 57 |
|  | Right | 25 | 29 | −2 | −1 | −12 | 3 | 8 | 23 |
| Sample 8 | Left | 22 | 47 | 5 | 4 | 14 | 20 | 21 | 37 |
|  | Right | −8 | −19 | −33 | −34 | −31 | −27 | −19 | −2 |
| Sample 9 | Left | 108 | 81 | 77 | 64 | 75 | 63 | 69 | 60 |
|  | Right | 52 | 47 | 27 | 20 | 18 | 21 | 25 | 12 |
| Sample 10 | Left | 2 | −5 | −6 | −6 | 3 | 4 | −23 | 15 |
|  | Right | −40 | −37 | −43 | −55 | −36 | −42 | −61 | −10 |

The following Table 9 shows the misalignment values amended on the basis of the center of the lead group of each TCP by using the misalignment amounts measured on the basis of the end portions of each TCP in Table 4 according to the above-described method. In this case, the measured values of each PCB land group and each corresponding TCP lead group are presented in Table 8 below.

TABLE 8

The widths (μm) of the PCB land and the TCP lead of the conventional printed circuit board

|  | measured width of land (a) | width of lead (b) | (a − b)/2 |
|---|---|---|---|
| Sample 1 | 210 | 170 | 20 |
| Sample 2 | 215 |  | 22.5 |
| Sample 3 | 210 |  | 20 |
| Sample 4 | 210 |  | 20 |
| Sample 5 | 210 |  | 20 |
| Sample 6 | 220 |  | 25 |

TABLE 9

The misalignment values (μm) on the basis of the center of the conventional printed circuit board

|  |  | TCP1 | TCP2 | TCP3 | TCP4 | TCP5 | TCP6 | TCP7 | TCP8 |
|---|---|---|---|---|---|---|---|---|---|
| Sample 1 | Left | −14 | −9 | −10 | −1 | −5 | −6 | 13 | 22 |
|  | Right | −68 | −39 | −42 | −51 | −46 | −43 | −34 | −30 |
| Sample 2 | Left | −46 | −44 | −31 | −25 | −11 | 13 | 23 | 23 |
|  | Right | −88 | −79 | −63 | −62 | −56 | −28 | −17 | −27 |
| Sample 3 | Left | −24 | −22 | −21 | −10 | 4 | 11 | 7 | 33 |
|  | Right | −63 | −59 | −47 | −47 | −43 | −34 | −28 | −13 |
| Sample 4 | Left | −47 | −41 | −10 | −28 | −19 | −15 | −2 | 13 |
|  | Right | −91 | −88 | −49 | −61 | −63 | −57 | −51 | −33 |
| Sample 5 | Left | −35 | −28 | −19 | −9 | 6 | 17 | 14 | 15 |
|  | Right | −83 | −69 | −52 | −52 | −44 | −33 | −32 | −37 |
| Sample 6 | Left | −38 | −11 | −20 | −3 | 12 | 15 | 37 | 52 |
|  | Right | −79 | −56 | −56 | −43 | −27 | −29 | −7 | 6 |

FIGS. 9A through 9I are graphs showing the misalignment values in Table 7, and each graph illustrates the misalignment of each sample on the basis of the center of each sample.

While the graphs of FIGS. 10A through 10E show the misalignment amounts of the conventional printed circuit board generally having an inclination toward the right ends of the graphs, the graphs of FIGS. 9A through 9I show the misalignment amounts of the shrinkage printed circuit board samples according to the present invention having an inclination approximately parallel to the axis of the TCPs.

Hence, the respective intervals between the PCB land groups in the left portion of the shrinkage printed circuit board 100 are set differently from the respective intervals between the PCB land groups at the right portion of the shrinkage printed circuit board 100, thereby maintaining the magnitudes of the respective misalignment generated in each TCP 200a through 200h to have constant values after the thermo-compression bonding process. Also, this prevents excessive thermal expansions of each TCP 200a through 200h generated by the accumulation of the respective thermal expansions thereof.

In the meantime, the misalignment values in Tables 7 and 9 are generated on the basis of the center of each TCP 200a through 200h, so the difference between the left misalignment value and the right misalignment value in the same TCP corresponds to the amount of thermal expansion generated in that TCP during the thermo-compression bonding process. Thus, Tables 10 and 11 show the amount of thermal expansion of each TCP 200a through 200h calculated by utilizing the data in Tables 7 and 9 relating to the shrinkage printed circuit board and the conventional printed circuit board.

TABLE 10

The thermal expansion amounts (μm) of the TCP in the shrinkage printed circuit board

|  | TCP1 | TCP2 | TCP3 | TCP4 | TCP5 | TCP6 | TCP7 | TCP8 | Average |
|---|---|---|---|---|---|---|---|---|---|
| Sample 1 | 36 | 33 | 28 | 34 | 40 | 35 | 45 | 44 | 37 |
| Sample 2 | 32 | 23 | 38 | 41 | 42 | 42 | 23 | 29 | 34 |
| Sample 3 | 46 | 25 | 30 | 42 | 53 | 36 | 26 | 31 | 36 |
| Sample 4 | 27 | 25 | 29 | 8 | 25 | 19 | 10 | 41 | 23 |
| Sample 5 | 38 | 28 | 42 | 43 | 31 | 39 | 34 | 30 | 36 |
| Sample 6 | 47 | 37 | 37 | 48 | 43 | 40 | 26 | 27 | 38 |
| Sample 7 | 43 | 29 | 36 | 44 | 53 | 47 | 44 | 34 | 41 |
| Sample 8 | 30 | 66 | 38 | 38 | 45 | 47 | 40 | 39 | 43 |
| Sample 9 | 56 | 34 | 50 | 44 | 57 | 42 | 44 | 48 | 47 |
| Sample 10 | 41 | 32 | 37 | 49 | 38 | 45 | 38 | 24 | 38 |

TABLE 11 the thermal expansion amounts (μm) of the TCP in the conventional printed circuit board

|  | TCP1 | TCP2 | TCP3 | TCP4 | TCP5 | TCP6 | TCP7 | TCP8 | Average |
|---|---|---|---|---|---|---|---|---|---|
| Sample 1 | 54 | 38 | 32 | 50 | 41 | 37 | 47 | 52 | 43.875 |
| Sample 2 | 42 | 35 | 32 | 37 | 45 | 40 | 39 | 49 | 39.875 |
| Sample 3 | 39 | 37 | 26 | 37 | 47 | 45 | 35 | 46 | 39 |
| Sample 4 | 44 | 47 | 39 | 33 | 44 | 42 | 49 | 46 | 43 |
| Sample 5 | 48 | 41 | 33 | 43 | 50 | 50 | 46 | 52 | 45.375 |
| Sample 6 | 41 | 45 | 36 | 40 | 39 | 44 | 44 | 46 | 41.875 |

A shown in Table 10, the average amount of thermal expansion generated in each of the TCPs is about 37 μm during the thermo-compression bonding process for the shrinkage printed circuit board, with a standard deviation of 9.9. However, the average amount of thermal expansion generated in each of the TCPs is about 42 μm during the thermo-compression bonding process for the conventional printed circuit board, with a standard deviation of 6.4.

FIGS. 9A through 9I are graphs comparing the results in Table 10 with the results in Table 11.

Referring to FIGS. 9A through 9I and Tables 10 and 11, it was assumed above that the tape carrier packages expand uniformly (unlike the conventional printed circuit board), and also, that the expansion of the printed circuit board and the expansion of the tape carrier package are independent of each other. The uniform expansion of the tape carrier packages is already mentioned in the above description for the shrinkage printed circuit board as an assumption according to the present invention.

According to the data in Tables 10 and 11, the average amount of expansion of each TCP 200a through 200h is about 40 μm and the amount of misalignment due to the expansion of each TCP 200a through 200h is about 20 μm. Since the printed circuit board and the tape carrier packages expand independently of each other, the shrinkage design for the tape carrier packages should be considered separately from the shrinkage design for the printed circuit board.

Hence, when the shrinkage printed circuit board 100 and the tape carrier packages are combined in a thermo-compression bonding process, the occasions of misalignment due to the thermal expansion of the printed circuit board can be remarkably reduced, thereby increasing the productivity by reducing failures during the bonding process.

As for the above-described embodiment of the present invention, although the printed circuit board is combined with the tape carrier package, a ductile circuit board can be used instead of the tape carrier package and the numbers of the PCB land and the tape carrier packages may also be arbitrarily selected according to their uses and functions.

Figure 12:
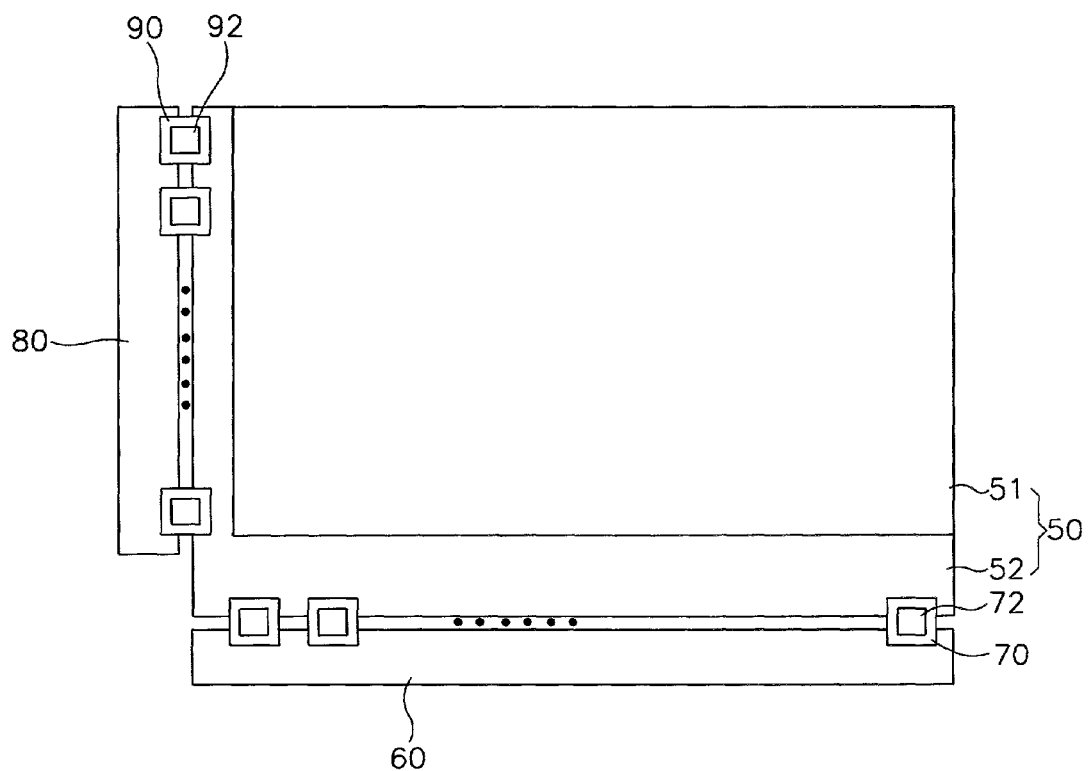
FIG. 12 is a plan view showing a liquid crystal display device including the shrinkage printed circuit board and the tape carrier package bonded to each other by the thermo-compression bonding method at a high temperature according to the present invention.

FIG. 12 is a plan view showing a liquid crystal display panel including the shrinkage printed circuit board and the tape carrier packages combined together by a thermo-compression bonding process at a high temperature.

Referring to FIG. 12, the liquid crystal display panel 50 receives the electrical signal from an external source and displays the information, the shrinkage printed circuit boards 60, 80 connected to the liquid crystal display panel 50 transfer the electrical signal to the liquid crystal display panel 50, and the tape carrier packages 70, 90 connect the liquid crystal display panel 50 to the shrinkage printed circuit boards 60, 80 to operate the liquid crystal display panel 50.

The liquid crystal display panel 50 includes a thin film transistor substrate 52 and a color filter substrate 51 facing the thin film transistor substrate 52.

A plurality of gate lines (not shown) are disposed in a line on the thin film transistor substrate 52 along the width of the thin film transistor substrate 52 and a plurality of data lines (not shown) are disposed in a line to intersect the gate lines. The data lines are disposed on the thin film transistor substrate 52 along the length of the thin film transistor substrate 52. Data input pads and gate input pads are respectively formed on the gate and the data lines exposed by the color filter substrate 51.

The shrinkage printed circuit boards 60 and 80 comprise a source shrinkage printed circuit board 60 electrically connected to the data input pads by means of the tape carrier packages 70 and a gate shrinkage printed circuit board 90 electrically connected to the gate input pads by means of the tape carrier packages 90.

The data driving integrated circuits (ICs) 72 and the source driving ICs 92 for driving the data and the gate lines are respectively disposed on the upper surfaces of the tape carrier packages 70 and 90.

Following is a description of a method for connecting the shrinkage printed circuit boards 60 and 80 to the liquid crystal display panel 50 by means of the tape carrier packages 70 and 90.

At first, after the anisotropic conductive film (not shown) is attached to the data and gate input pads, the output ends of the tape carrier packages 70 and 90 are positioned on the surface of the anisotropic conductive film, and the surfaces of the tape carrier packages 70 and 90 are then pressed by using a thermo-compression device. Thus, the gate and the data input pads and the respective output leads (not shown) of the tape carrier packages 70 and 90 are electrically connected while the anisotropic conductive film, which comprises a thermoplastic resin, is completely compressed onto the liquid crystal display panel 50 by the thermo-compression device.

Subsequently, after the anisotropic conductive film is attached to the surface of the PCB land groups formed on a rear surface of the shrinkage printed circuit boards 60 and 80, the input leads (not shown) of the tape earlier packages 70 and 90 are attached to the rear surfaces of the shrinkage printed circuit boards 60 and 80 by using the thermo-compression device. Hence, the input leads of the tape carrier packages 70 and 90 are electrically connected to the PCB lands (not shown) of the shrinkage printed circuit boards 60 and 80, while the anisotropic conductive film is hardened by the heat and the force of the thereto-compression device at a high temperature.

At that time, as described above, the amounts of misalignment between the respective lands of the shrinkage printed circuit boards 60 and 80 and the leads of the tape carrier packages 70 and 90 corresponding to the respective lands of the shrinkage printed circuit boards 60 and 80 are uniformly generated and the average misalignment value becomes 8 μm.

After a back light assembly (not illustrated) is installed beneath the liquid crystal display panel 50, the liquid crystal display device is completed by fixing the liquid crystal display panel and the back light assembly to a mold frame (not illustrated).

According to the present invention, when the PCB land groups are themmocompressed with tape carrier packages byshrinking the PCB land groups of the printed circuit board by the amount of thermal expansion of the printed circuit board occurring during the thermo-compression, the misalignment between respective PCB land groups and corresponding TCP lead groups due to the thermal expansion of the printed circuit board can be decreased to secure a sufficient processing margin, so that productivity is improved by reducing the number of processing failures. Also, the amount of misalignment can be uniformly maintained so as to enhance the probability for controlling the misalignment and to increase the stability of the product.

While the present invention has been particularly shown and described with reference to preferred embodiments thereof, it will be understood by those skilled in the art that various changes in form and detail may be effected therein without departing from the spirit and scope of the invention as defined by the appended claims.

What is claimed is:

1. A method for manufacturing an assembly including a printed circuit board and a plurality of tape carrier packages attached to the printed circuit board, each of the tape carrier packages having conductive leads parallel with each other, the method comprising:

arranging the tape carrier packages along a common axis such that center lines of the tape carrier packages, which are substantially perpendicular to the common axis, wherein the central lines of the tape carrier package adjacent to each other are spaced apart from each other at respective first intervals;

forming a plurality of land groups on the printed circuit board, the land groups comprising conductive leads respectively and being arranged along the common axis, center lines of the land groups, which are substantially perpendicular to the common axis, being spaced apart from each adjacent other at respective second intervals determined in accordance with thermal expansion properties of the printed circuit board such that, in a pre-compression bonded state, the respective second intervals are smaller than the respective first intervals;

thermocompression bonding the tape carrier packages to the printed circuit board; and, during the thermocompression bonding, allowing the printed circuit board to expand such that the respective lands are substantially aligned with corresponding ones of the leads of the tape carrier packages.

2. The method of claim 1, further comprising measuring the thermal expansion properties of the printed circuit board before forming the lands thereon.

3. The method of claim 1, wherein the respective second intervals between adjacent ones of the land groups are asymmetric with respect to a line passing through the middle of a width of the printed circuit board when the printed circuit board is asymmetric with respect to said line.

4. A printed circuit board capable of being adapted to be electrically connected to an external device through a plurality of tape carrier packages, each of the tape carrier packages having a conductive lead group which includes a plurality of conductive leads, the tape carrier packages being arranged such that center lines of the conductive lead groups of the tape carrier packages are spaced from each adjacent other at first intervals, the printed circuit board comprising:

a substrate; and, a plurality of conductive land groups formed on the substrate and disposed parallel to and spaced apart from each other such that center lines of the land groups are spaced apart from each adjacent other at second intervals, respective one of the plurality of conductive land groups corresponding to a respective one of the conductive lead groups of the tape carrier packages, wherein the second intervals are respectively smaller than the first intervals.

5. The printed circuit board of claim 4, wherein the second intervals respectively become substantially the same as the first intervals by thermal expansion when the printed circuit board undergoes a thermo-compression bonding process.

6. The printed circuit board of claim 4, wherein the second intervals are asymmetric with respect to a line passing through a midpoint of a width of the printed circuit board when the printed circuit board is asymmetric with respect to said line.

7. A method of manufacturing a printed circuit board capable of being electrically connected to an external device through a plurality of tape carrier packages spaced apart from each other, comprising:

forming land groups that correspond one-to-one with each of the tape carrier packages on a substrate such that intervals between center lines of the land groups are respectively smaller than intervals between center lines of the tape carrier packages.

8. The method of claim 7, wherein the interval between the printed circuit board land groups determined by:
   measuring an amount of total thermal expansion of the substrate under a thermocompression bonding process, and
   obtaining the interval between the printed circuit board land groups by considering the amount of total thermal expansion.

* * * * *